(12) United States Patent
Anderson et al.

(10) Patent No.: US 12,034,005 B2
(45) Date of Patent: Jul. 9, 2024

(54) SELF-ALIGNED METAL GATE WITH POLY SILICIDE FOR VERTICAL TRANSPORT FIELD-EFFECT TRANSISTORS

(71) Applicant: International Business Machines Corporation, Armonk, NY (US)

(72) Inventors: Brent A. Anderson, Jericho, VT (US); Ruqiang Bao, Niskayuna, NY (US); Dechao Guo, Niskayuna, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 279 days.

(21) Appl. No.: 17/133,157

(22) Filed: Dec. 23, 2020

(65) Prior Publication Data

US 2021/0118881 A1    Apr. 22, 2021

Related U.S. Application Data

(62) Division of application No. 15/593,816, filed on May 12, 2017, now Pat. No. 10,957,696.

(51) Int. Cl.
*H01L 27/092* (2006.01)
*H01L 21/8238* (2006.01)
(Continued)

(52) U.S. Cl.
CPC .... *H01L 27/092* (2013.01); *H01L 21/823814* (2013.01); *H01L 21/823835* (2013.01);
(Continued)

(58) Field of Classification Search
CPC ............. H01L 29/0657; H01L 29/0676; H01L 29/068; H01L 29/0847; H01L 29/1041;
(Continued)

(56) References Cited

U.S. PATENT DOCUMENTS 7,772,066 B2    8/2010    Forbes
8,415,209 B2    4/2013    Rooyackers et al.
(Continued)

OTHER PUBLICATIONS

D. Hähnel et al., "Germanium Vertical Tunneling Field-Effect Transistor," Solid State Electronics, Mar. 22, 2011, pp. 132-137, vol. 62.
(Continued)

*Primary Examiner* — Meiya Li
(74) *Attorney, Agent, or Firm* — Kimberly Zillig; Ryan, Mason & Lewis LLP

(57) ABSTRACT

A method of forming a semiconductor structure includes forming an interfacial layer surrounding at least one channel stack, forming a high-k dielectric layer surrounding the interfacial layer, and forming a metal gate layer surrounding the high-k dielectric layer. The method also includes forming a silicon layer over the metal gate layer and forming at least one additional metal layer over the silicon layer. The method further includes performing silicidation to transform at least a portion of the at least one additional metal layer and at least a portion of the silicon layer into a silicide layer. The metal gate layer, the silicon layer and the silicide layer form at least one gate electrode for a vertical transport field-effect transistor (VTFET).

20 Claims, 29 Drawing Sheets

(51) Int. Cl.
*H01L 29/08* (2006.01)
*H01L 29/66* (2006.01)
*H01L 29/78* (2006.01)

(52) U.S. Cl.
CPC .. *H01L 21/823885* (2013.01); *H01L 29/0847* (2013.01); *H01L 29/66545* (2013.01); *H01L 29/66666* (2013.01); *H01L 29/7827* (2013.01); *H01L 29/7845* (2013.01)

(58) Field of Classification Search
CPC ............... H01L 29/105; H01L 29/1608; H01L 29/42376; H01L 29/517; H01L 29/518; H01L 29/66068; H01L 29/66356; H01L 29/66439; H01L 29/66469; H01L 29/665; H01L 29/66553; H01L 29/66666; H01L 29/66977; H01L 29/7391; H01L 29/775; H01L 29/7827
See application file for complete search history.

(56) References Cited

U.S. PATENT DOCUMENTS

| | | | |
|---|---|---|---|
| 8,564,034 B2* | 10/2013 | Masuoka | H01L 27/14616 250/214.1 |
| 8,754,470 B1 | 6/2014 | Chuang et al. | |
| 9,111,780 B2 | 8/2015 | Chuang et al. | |
| 9,318,583 B2 | 4/2016 | Verhulst et al. | |
| 9,385,195 B1 | 7/2016 | Zhang | |
| 9,972,494 B1 | 5/2018 | Bentley et al. | |
| 2009/0291551 A1 | 11/2009 | Cho | |
| 2013/0095620 A1* | 4/2013 | Hoentschel | H01L 21/823864 438/231 |
| 2014/0106523 A1* | 4/2014 | Koldiaev | H01L 29/78696 438/212 |
| 2014/0353593 A1* | 12/2014 | Smets | H01L 29/0676 257/39 |
| 2015/0069458 A1 | 3/2015 | Li et al. | |
| 2015/0303270 A1* | 10/2015 | Liaw | H01L 23/528 257/9 |
| 2015/0318213 A1* | 11/2015 | Tsai | H01L 29/66666 438/268 |
| 2015/0318214 A1 | 11/2015 | Tsai et al. | |

OTHER PUBLICATIONS

IBM Patents or Patent Applications Treated as Related.

\* cited by examiner

SELF-ALIGNED METAL GATE WITH POLY SILICIDE FOR VERTICAL TRANSPORT FIELD-EFFECT TRANSISTORS

BACKGROUND

The present application relates to semiconductors, and more specifically, to techniques for forming semiconductor structures. Memory chips and logic devices may utilize semiconductor structures such as fin field-effect transistors (FinFETs). The scaling of such silicon MOSFET structures to theoretically predicted miniaturization limits, however, cannot be accomplished by simply shrinking all features of the MOSFET to specified dimensions.

SUMMARY

Embodiments of the invention provide techniques for forming self-aligned metal gates with poly silicide for vertical transport field-effect transistors (VTFETs).

For example, in one embodiment a method of forming a semiconductor structure comprises forming an interfacial layer surrounding at least one channel stack, forming a high-k dielectric layer surrounding the interfacial layer, forming a metal gate layer surrounding the high-k dielectric layer, forming a silicon layer over the metal gate layer, forming at least one additional metal layer over the silicon layer, and performing silicidation to transform at least a portion of the at least one additional metal layer and at least a portion of the silicon layer into a silicide layer. The metal gate layer, the silicon layer and the silicide layer form at least one gate electrode for a VTFET.

In another embodiment, a semiconductor structure comprises an interfacial layer surrounding at least one channel stack, a high-k dielectric layer surrounding the interfacial layer above the channel stack, a metal gate layer surrounding the high-k dielectric layer, a silicon layer surrounding the metal gate layer, and a silicide layer surrounding the silicon layer. The metal gate layer, the silicon layer and the silicide layer provide a gate electrode for a VTFET.

In another embodiment, an integrated circuit comprises a VTFET. The VTFET comprises an interfacial layer surrounding at least one channel stack, a high-k dielectric layer surrounding the interfacial layer, a metal gate layer surrounding the high-k dielectric layer, a silicon layer surrounding the metal gate layer, and a silicide layer surrounding the silicon layer, wherein the metal gate layer, the silicon layer and the silicide layer provide a gate electrode for the VTFET.

DETAILED DESCRIPTION

Illustrative embodiments of the invention may be described herein in the context of illustrative methods for forming self-aligned metal gates with poly silicide for VTFETs, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

As discussed above, further scaling of semiconductor structures used in memory chips and logic devices is not possible with existing techniques such as FinFETs. New methods or architectures are needed to achieve higher integration density than that feasible using existing techniques such as FinFETs. The scaling of silicon MOSFETs to theoretically predicted miniaturization limits cannot be accomplished be simply shrinking all device features of the MOSFET to specified dimensions—new device features are required. The gate length and thickness are of particular concern in trying to further scale MOSFETs. Vertical transport field-effect transistors (VTFETs), as described herein, can provide improved device scaling benefits relative to FinFETs.

Formation of a reliable gate stack for VTFETs, however, is challenging due to the very high thermal budget for top source and drain epis and the deposition of an encapsulation layer. As a result, the inversion layer thickness ($T_{inv}$) and threshold voltage (Vt) for this gate stack is difficult to achieve.

Embodiments provide several advantages which facilitate formation of VTFETs, including forming reliable gate stacks for VTFETs. In some embodiments an oxygen barrier layer, such as a silicon (Si) layer, is used to prevent $T_{inv}$ increase from oxygen diffusion into a high-K (HK) metal gate. Embodiments may also provide a self-alignment spacer hard mask (HM) used to define poly silicide gates.

A general process flow used in some embodiments will now be described with respect to FIGS. 1-29.

Figure 1:
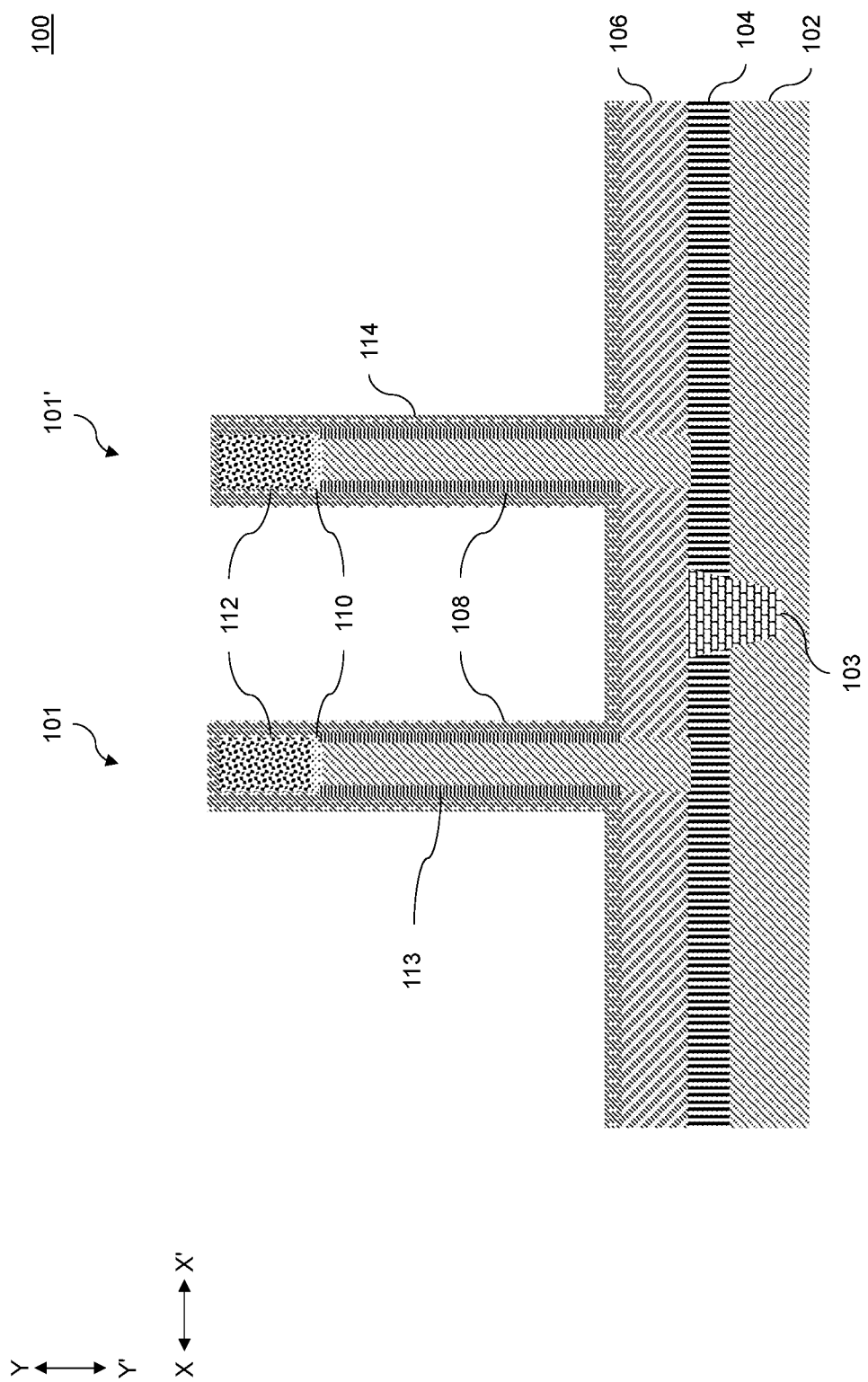
FIG. 1 depicts a cross-sectional view of a structure, according to an embodiment of the present invention.

FIG. 1 shows a cross-sectional view 100 of a structure following upstream processing wherein a substrate 102 is formed, a bottom contact 104 is formed over the substrate 102, and a bottom spacer 106 is formed between channels 108. An oxide layer 110 is formed over each of the channels 108, and a nitride hard mask 112 is formed over the oxide layer 110 on each of the channels 108. A HK dielectric layer 114 is deposited over the spacer 106, channels 108, oxide layer 110 and nitride hard mask 112. An interfacial layer 113, such as silicon dioxide ($SiO_2$) and/or silicon oxynitride (SiON), may be formed below the HK dielectric layer 114 and above the channels 108. For clarity of illustration, the interfacial layer 113 is not shown in other figures described below. A shallow trench isolation (STI) features 103 is formed as shown in the substrate 102 and bottom contact 104 between the channels 108.

As will be described in further detail below, each of the channels 108 may be used in forming a negative channel field-effect transistor (NFET) or a positive channel field-effect transistor (PFET). For example, the channel stack 101 of channel 108, oxide layer 110 and nitride hard mask 112 may be used to form an NFET while the channel stack 101' of channel 108, oxide layer 110 and nitride hard mask 112 may be used to form a PFET.

The substrate 102 may be formed of Si, although other suitable materials such as germanium (Ge) and silicon carbide (SiC) may be used. The substrate 102 may have a vertical thickness (in direction Y-Y') ranging from several microns to several centimeters. The horizontal width of the substrate 102 (in direction X-X') may vary as desired, such as based on the number of NFET and PFET structures to be formed as well as the desired spacing between the NFET and PFET structures. It is to be appreciated that while FIG. 1 and other figures described herein show only a single NFET and PFET being formed for clarity of illustration, embodiments are not so limited. Any desired number of NFETs and PFETs may be formed using the techniques described herein.

Bottom contact 104 may be formed of highly doped silicon plus silicide in the contact region. The bottom contact 104 may have a vertical thickness (in direction Y-Y') ranging from 10 nanometers (nm) to 500 nm. The horizontal width (in direction X-X') of the bottom contact 104 may match that of the substrate 102.

Bottom spacer 106 may be formed of silicon nitride (SiN) or another suitable material such as silicon boron carbon nitride (SiBCN), silicon oxycarbon (SiOCN) and silicon carbon nitride (SiCN). The bottom spacer 106 may have a vertical thickness (in direction Y-Y') ranging from 2 nm to 20 nm. The horizontal width (in direction X-X') of the bottom spacer 106 may match that of the substrate 102, excluding the portions taken up by the channels 108 as illustrated.

Channels 108 may be formed of silicon (Si). In some embodiments, the channels 108 may be formed of silicon germanium (SiGe), where the germanium (Ge) concentration may range from 10% to 40%. In other embodiments, the NFET may utilize a group III-V semiconductor for the channel stack 101 while the PFET utilizes pure Ge for the channel stack 101'. The channels 108 may have a vertical thickness (in direction Y-Y') ranging from 10 nm to 80 nm. The horizontal width (in direction X-X') of each of the channels 108 may range from 10 nm to 70 nm. The spacing between the channels 108 may range from 20 nm to 60 nm.

Oxide layer 110 may be formed of $SiO_2$. The oxide layer 110 may have a vertical thickness (in direction Y-Y') ranging from 1 nm to 30 nm. The horizontal width (in direction X-X') of the oxide layer 110 may match that of the underlying channels 108.

Nitride hard mask 112 may be formed of SiN. The nitride hard mask 112 may have a vertical thickness (in direction Y-Y') ranging from 10 nm to 60 nm. The horizontal width (in direction X-X') of the nitride hard mask 112 may match that of the underlying oxide layer 110 and underlying channels 108.

HK dielectric layer 114 may be formed of hafnium dioxide ($HfO_2$) or another suitable material such as lanthanum oxide ($La_2O_3$), zirconium oxide ($Zr_2O_3$), or aluminum oxide ($Al_2O_3$). The HK dielectric layer 114 may have a uniform thickness (e.g., in both direction X-X' and direction Y-Y') ranging from 1 nm to 3 nm.

The structure shown in FIG. 1 is the result of various upstream processing, growth of the HK dielectric layer 114, and following high k dielectric annealing of the structure post deposition of the HK dielectric layer 114. The FIG. 1 structure may have also undergone a special anneal to improve the dielectric reliability.

Figure 2:
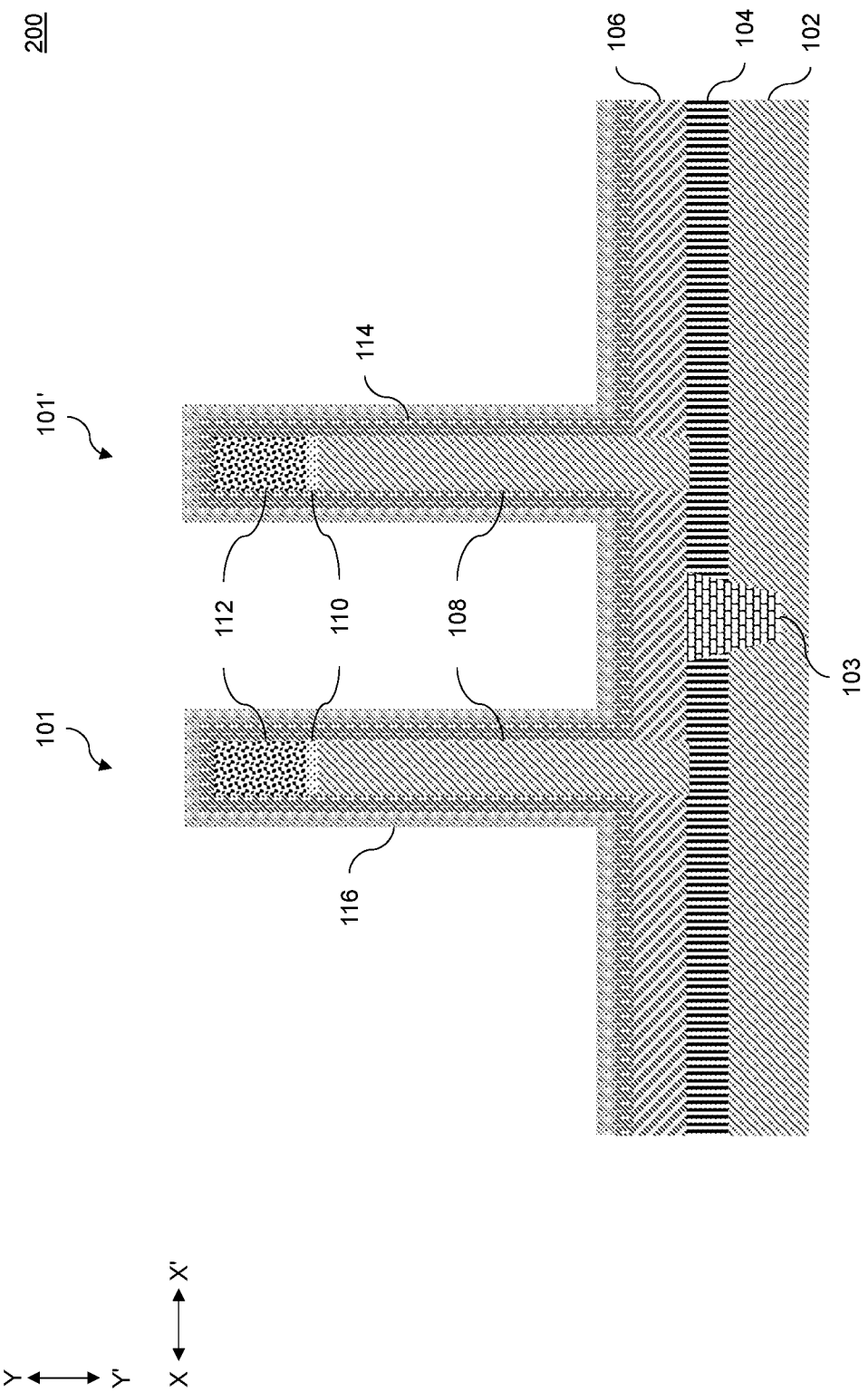
FIG. 2 depicts a cross-sectional view of the FIG. 1 structure following deposition of a metal gate, according to an embodiment of the present invention.

FIG. 2 shows a cross-sectional view 200 of the FIG. 1 structure following deposition of a metal gate layer 116. The metal gate layer 116 may be formed of a work function metal such as titanium nitride (TiN), although other suitable materials such as tantalum nitride (TaN) may be used. The metal gate layer 116 may be formed using atomic layer deposition (ALD) or an ALD-like process. The metal gate layer 116 may have a uniform thickness (e.g., in both direction X-X' and direction Y-Y') ranging from 1 nm to 3 nm.

Figure 3:
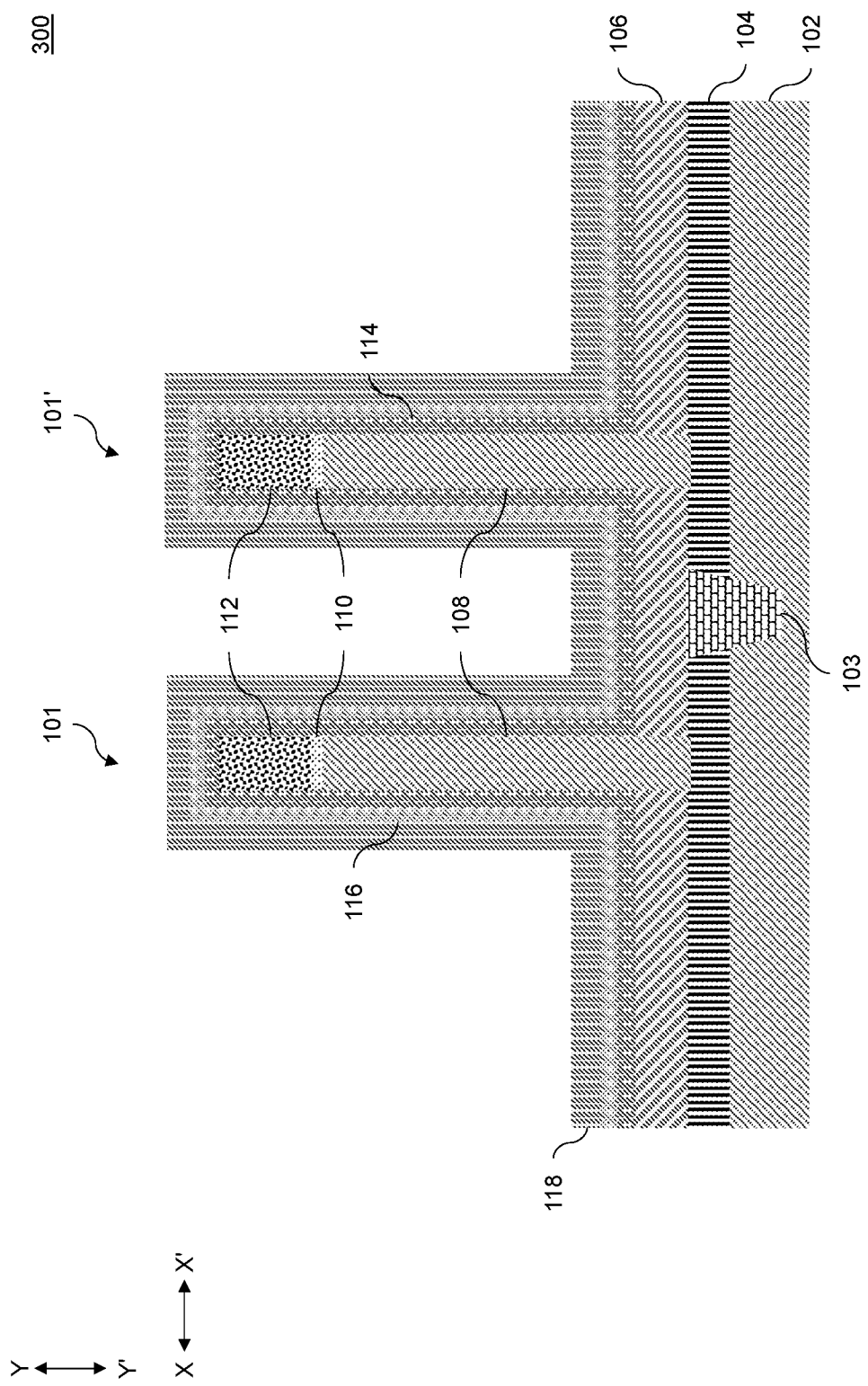
FIG. 3 depicts a cross-sectional view of the FIG. 2 structure following deposition of a silicon layer, according to an embodiment of the present invention.

FIG. 3 shows a cross-sectional view 300 of the FIG. 2 structure following deposition of a silicon layer 118. The silicon layer 118 may be amorphous silicon (a-Si), amorphous polysilicon (a-poly Si) or another suitable material such as amorphous SiGe. The silicon layer 118 may be formed using a chemical vapor deposition (CVD) or ALD process. The silicon layer 118 may have a uniform thickness (e.g., in both direction X-X' and direction Y-Y') ranging from 1 nm to 6 nm.

Figure 4:
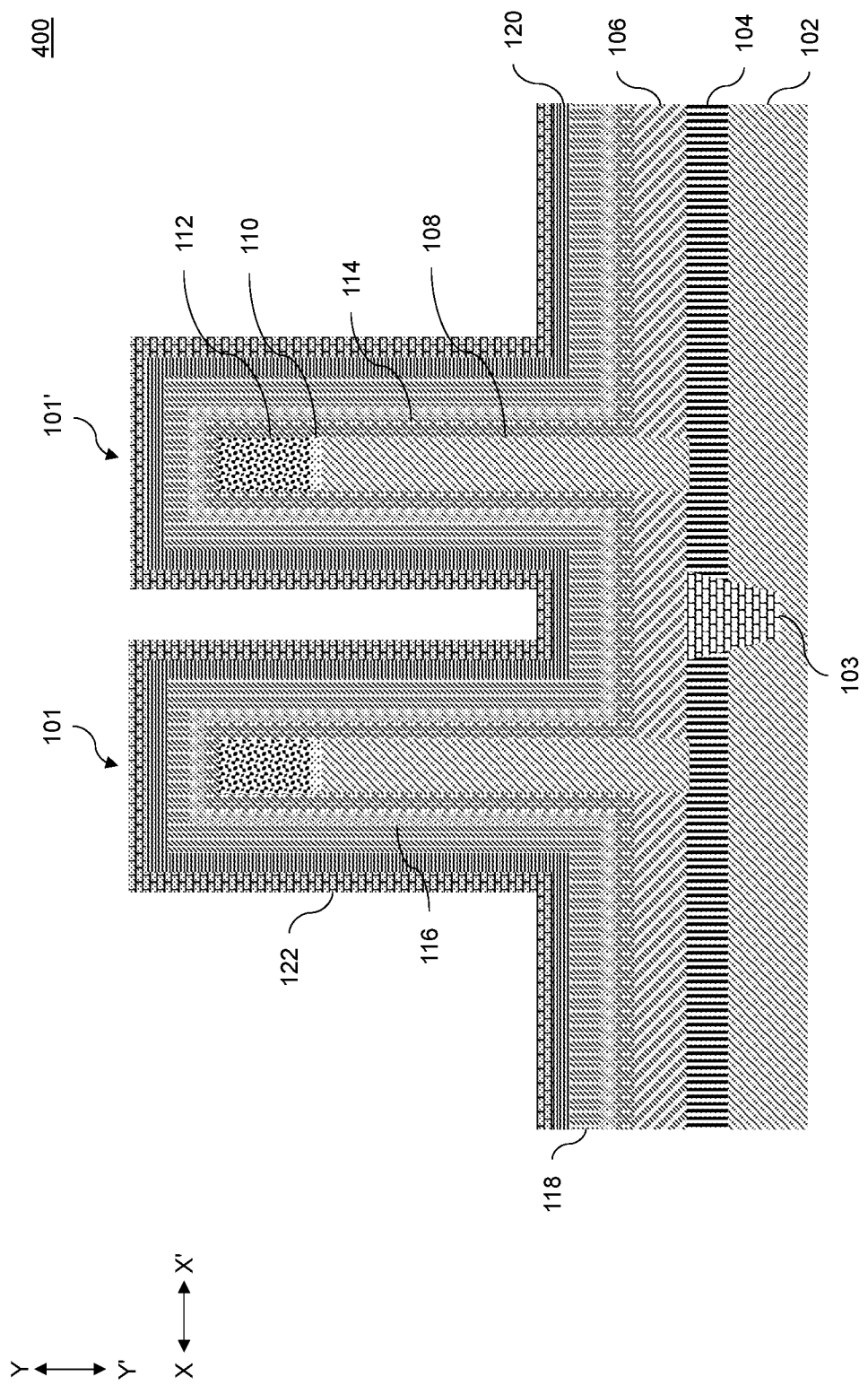
FIG. 4 depicts a cross-sectional view of the FIG. 3 structure following deposition of additional metal layers, according to an embodiment of the present invention.

FIG. 4 shows a cross-sectional view 400 of the FIG. 3 structure following deposition of additional metal layers 120 and 122. The metal layers 120 and 122 may be used for formation of a silicide, as will be described in further detail below. The metal layer 120 may be formed using physical vapor deposition (PVD) or ALD, and the metal layer 122 may be formed using ALD.

The metal layer 120 may be formed of titanium (Ti), although other suitable materials such as nickel (Ni), tungsten (W), cobalt (Co), tantalum (Ta), titanium aluminide (TiAl), tantalum aluminide (TaAl), a titanium aluminum carbide (TiAlC), or a tantalum aluminum carbide (TaAlC) may be used. The metal layer 120 may have a uniform thickness (e.g., in both direction X-X' and direction Y-Y') ranging from 1 nm to 3 nm.

The metal layer 122 may be formed of TiN although other suitable materials, including metal nitrides like TaN and metal carbides like titanium carbide (TiC) and tantalum carbide (TaC) may be used. The metal layer 122 may have a uniform thickness (e.g., in both direction X-X' and direction Y-Y') ranging from 1 nm to 3 nm.

Figure 5:
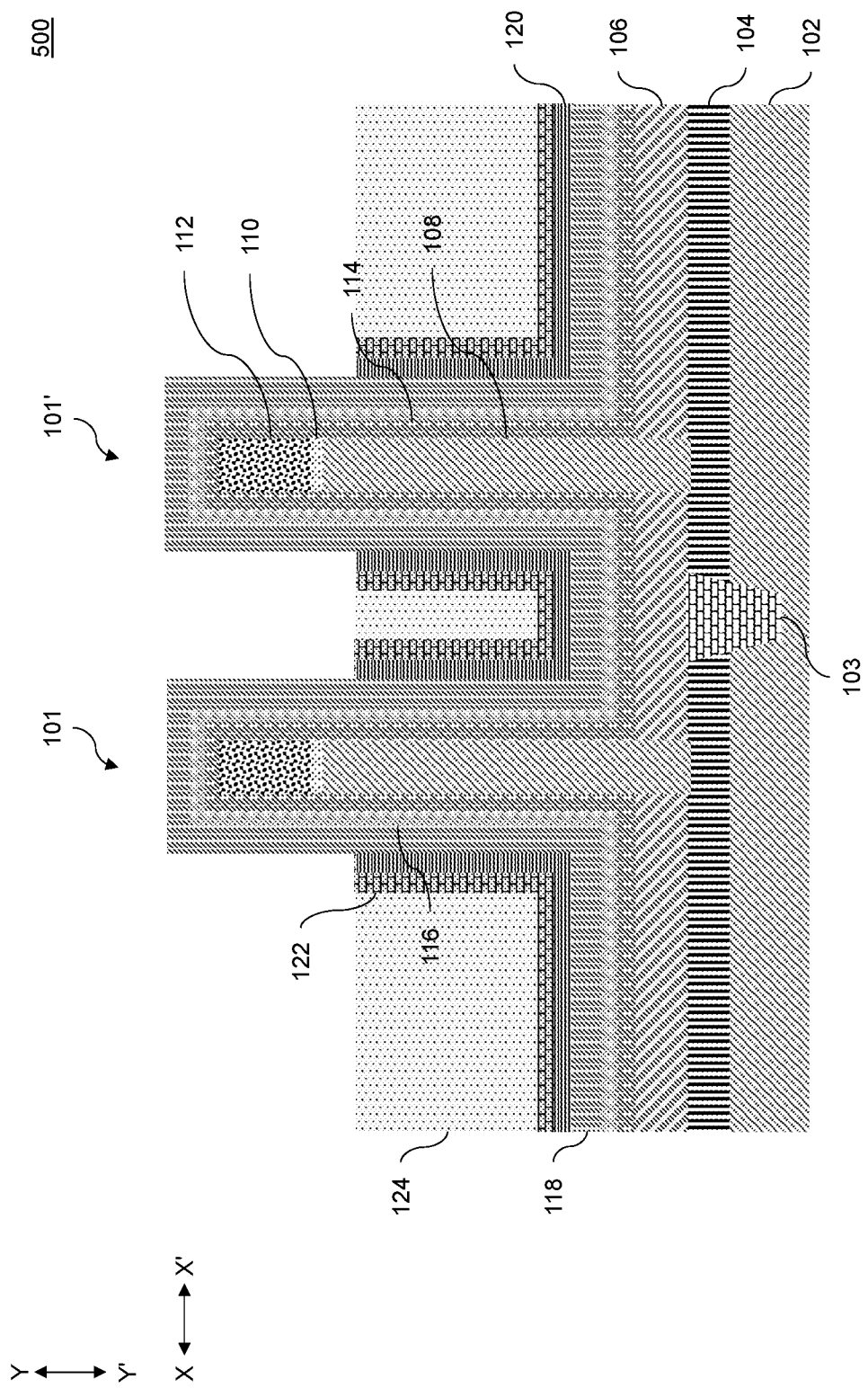
FIG. 5 depicts a cross-sectional view of the FIG. 4 structure following formation of a sacrificial layer and recess of sacrificial layer and additional metal layers, according to an embodiment of the present invention.

FIG. 5 shows a cross-sectional view 500 of the FIG. 4 structure following formation of an organic planarization layer (OPL) 124 and recess of the OPL 124 and metal layers 120 and 122. The OPL 124 may be formed using spin coating. The OPL 124 and metal layers 120 and 122 may be recessed using reaction-ion etching (RIE). The OPL 124 may initially be formed to cover the entire FIG. 4 structure. Following the recess, the vertical thickness (in direction Y-Y') of the OPL 124 may range from 10 nm to 50 nm. The recess of the metal layers 120 and 122 is used to define the gate length of the resulting structure.

Figure 6:
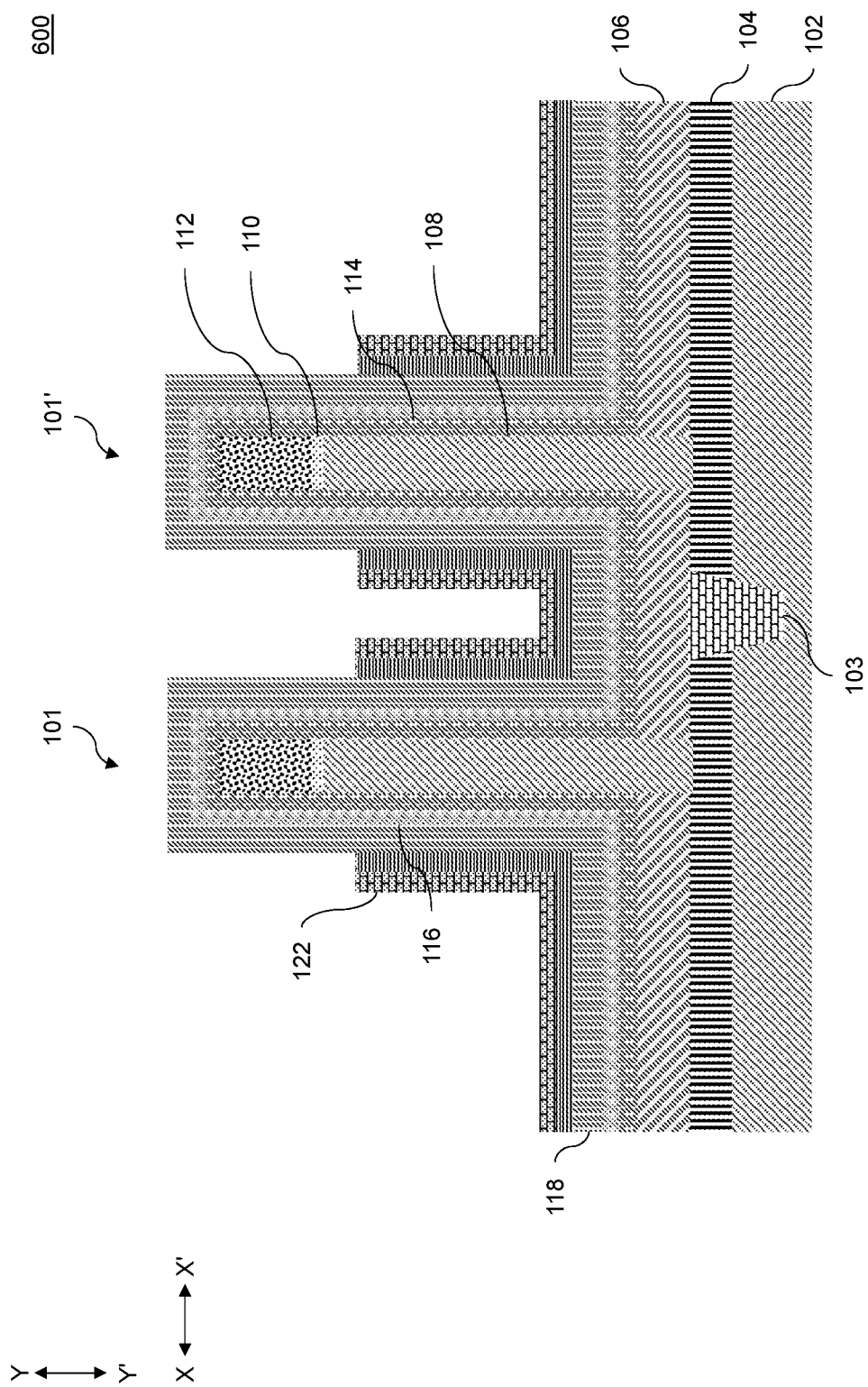
FIG. 6 depicts a cross-sectional view of the FIG. 5 structure following removal of the sacrificial layer, according to an embodiment of the present invention.

FIG. 6 shows a cross-sectional view 600 of the FIG. 5 structure following removal of the remaining OPL 124. The OPL 124 may be removed or stripped using ashing.

Figure 7:
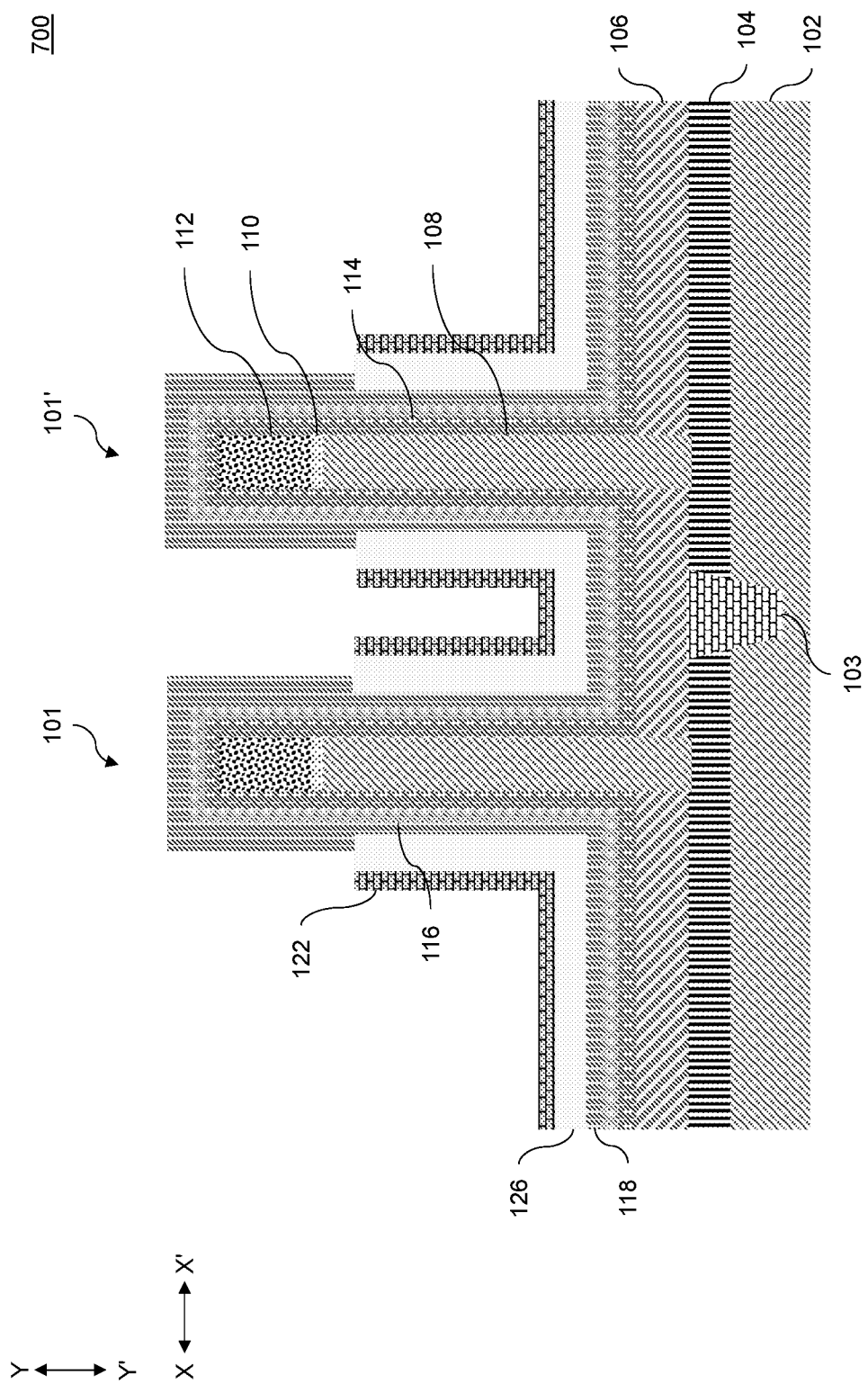
FIG. 7 depicts a cross-sectional view of the FIG. 6 structure following formation of a silicide, according to an embodiment of the present invention.

FIG. 7 shows a cross-sectional view 700 of the FIG. 6 structure following silicidation to form silicide 126. The silicide 126 forms a poly-silicide gate of the resulting structure. The anneal temperature range could be from 500° C. to 1100° C. Formation of the silicide 126 advantageously reduces gate electrode resistivity in the resulting structure. In some embodiments, the gate electrode includes a metal (e.g., metal gate layer 116, which may be formed of a nitride such as TiN, a pure metal such as Al, Ti or combinations thereof, a carbide such as TiAlC, TaAlC, etc. as discussed above) plus a-Si (e.g., silicon layer 118) and the silicide 126. This combination of metal, a-Si and silicide reduces the gate resistance.

In the cross-sectional view 700, the structure may be viewed as having first and second regions. The first region includes portions of the silicon layer 118, metal gate layer 116, HK dielectric layer 114, etc. which are surrounded by the recessed portions of the metal layers 120 and 122. The second region includes portions of the silicon layer 118, metal gate layer 116, HK dielectric layer 114, etc. which are left exposed by the recess of the OPL 124 and the metal layers 120 and 122. While FIG. 7 shows an example where only a portion of the silicon layer 118 in the first region is transformed into the silicide 126, embodiments are not limited to this arrangement. In other embodiments, all of the silicon layer 118 in the first region may be transformed into the silicide 126. Generally, the gate resistance is lowered as more of the silicon layer 118 in the first region is transformed into the silicide 126. However, the silicidation procedure, such as the above-described annealing process, may be difficult to control such that for ease of fabrication some but not all of the silicon layer 118 in the first region is transformed into silicide 126.

Figure 8:
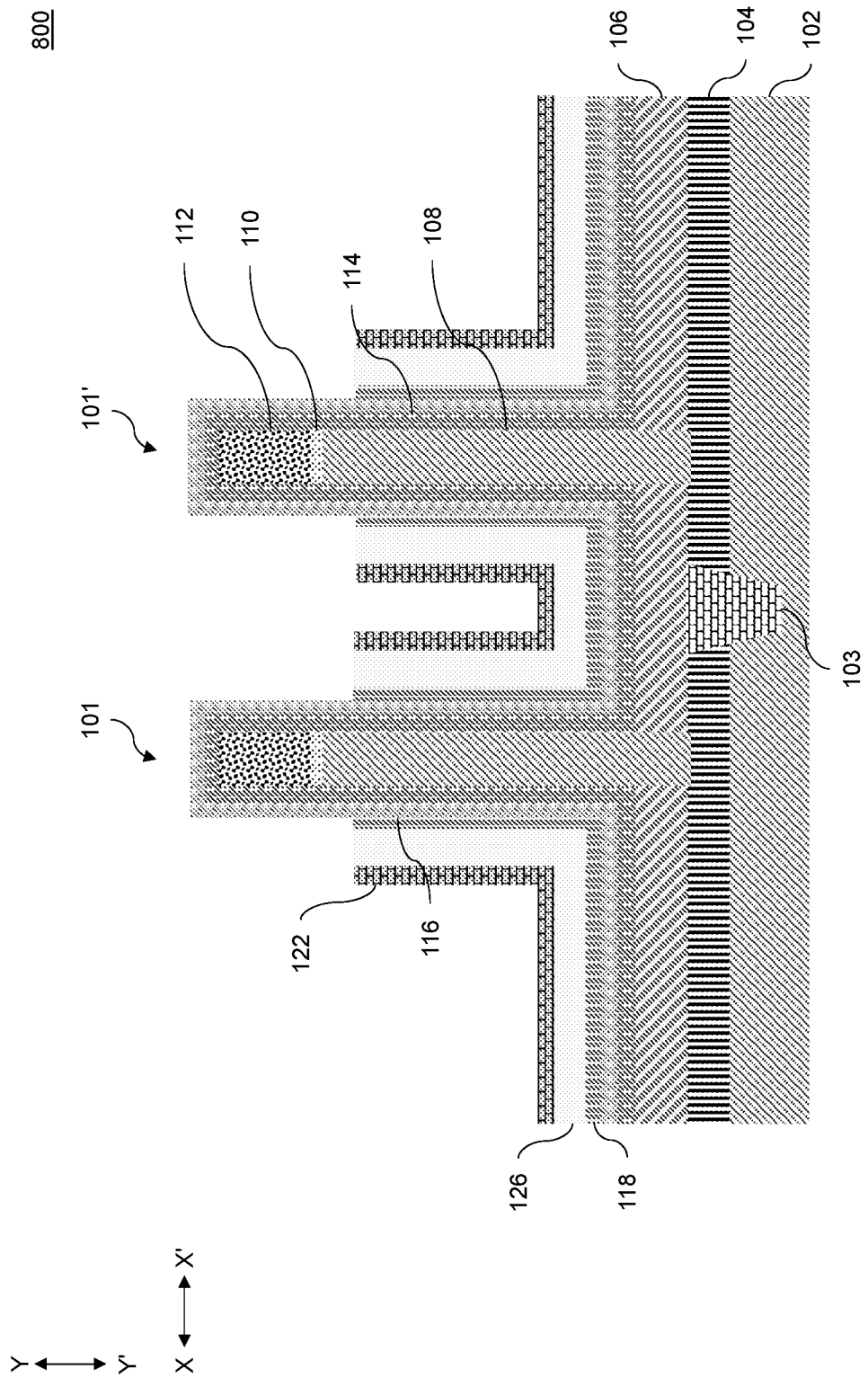
FIG. 8 depicts a cross-sectional view of the FIG. 7 structure following removal of the silicon layer, according to an embodiment of the present invention.

FIG. 8 shows a cross-sectional view 800 of the FIG. 7 structure following removal of the silicon layer 118 above the silicide 126 (e.g., the silicon layer 118 in the second region described above). The silicon layer 118 may be removed using a wet etchant, such as hot ammonia, although other etchants such as tetraethyl ammonium hydroxide (TEAH) may be used in other embodiments.

Figure 9:
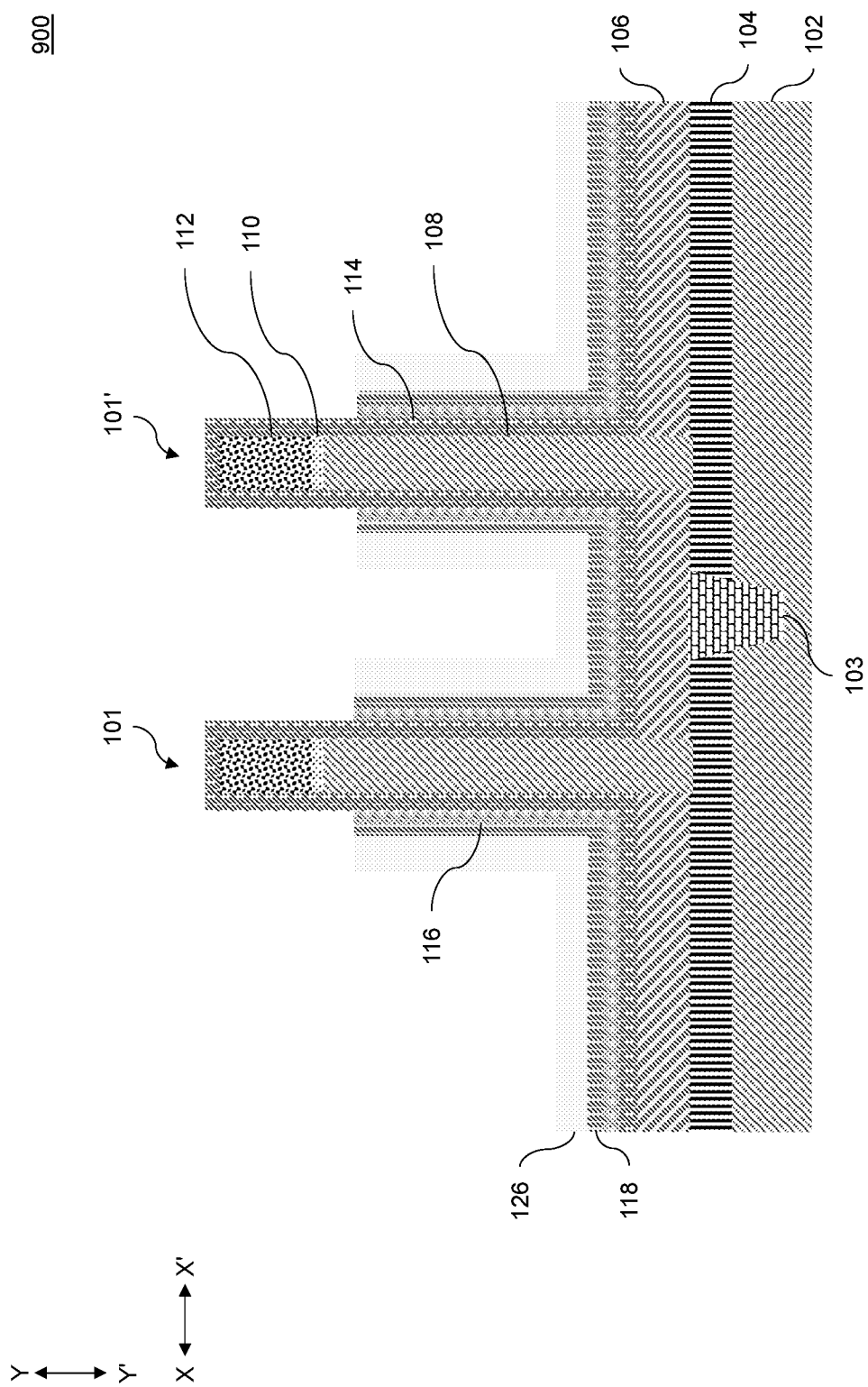
FIG. 9 depicts a cross-sectional view of the FIG. 8 structure following removal of the additional metal layers, according to an embodiment of the present invention.

FIG. 9 shows a cross-sectional view 900 of the FIG. 8 structure following removal of the metal layer 122, as well as removal of the metal gate layer 116 above the silicide (e.g., the metal gate layer 116 in the second region described above). The metal layer 122 and metal gate layer 116 may be removed using a wet etchant.

Figure 10:
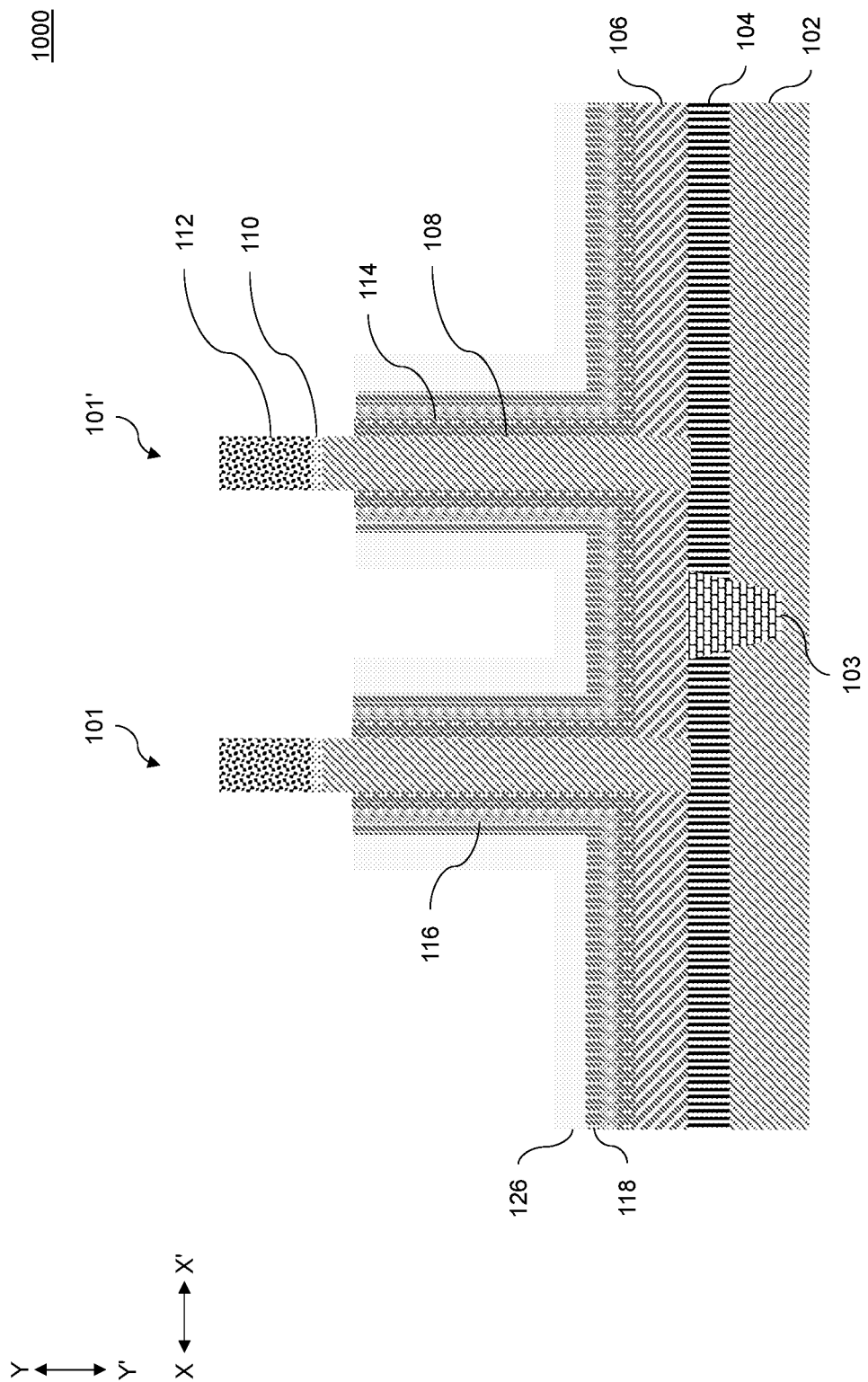
FIG. 10 depicts a cross-sectional view of the FIG. 9 structure following removal of the high-k dielectric layer, according to an embodiment of the present invention.

FIG. 10 shows a cross-sectional view 1000 of the FIG. 9 structure following removal of the HK dielectric layer 114 above the silicide 126 (e.g., the HK dielectric layer 114 in the second region described above). The HK dielectric layer 114 may be stripped or removed using a wets process.

In some embodiments, the steps illustrated in FIGS. 5-10 may be replaced with the steps described below with respect to FIGS. 25-29.

Figure 11:
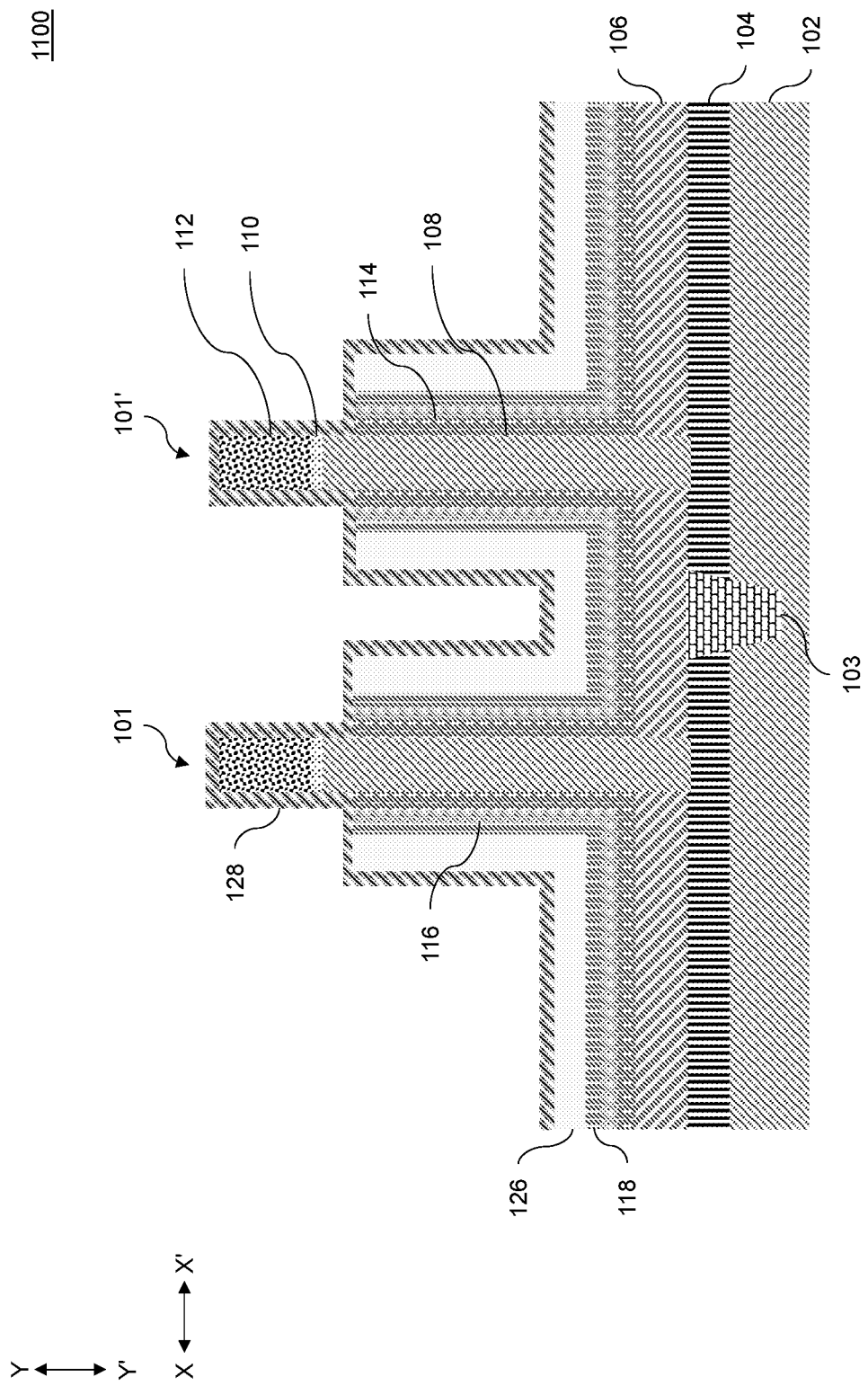
FIG. 11 depicts a cross-sectional view of the FIG. 10 structure following deposition of an encapsulation layer, according to an embodiment of the present invention.

FIG. 11 shows a cross-sectional view 1100 of the FIG. 10 structure, or alternately the FIG. 29 structure as will be described in further detail below, following deposition of an encapsulation layer 128. The encapsulation layer 128 may be formed using ALD. The encapsulation layer 128 may be formed of SiN, although other suitable materials such as SiOC, SiBCN, and SiCN may be used. The encapsulation layer 128 may have a uniform thickness (e.g., in both direction X-X' and direction Y-Y') ranging from 2 nm to 10 nm.

Figure 12:
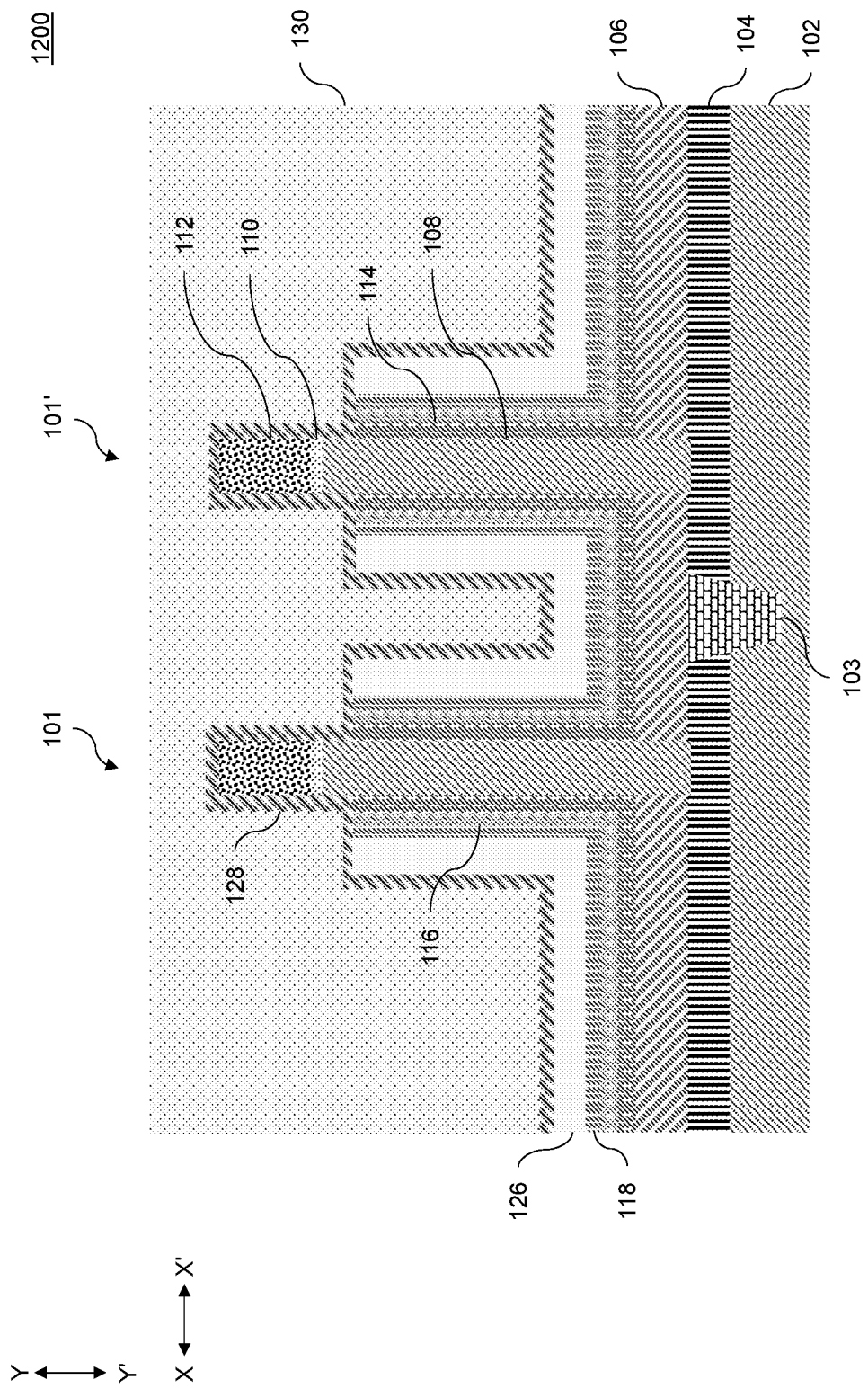
FIG. 12 depicts a cross-sectional view of the FIG. 11 structure following an oxide fill, according to an embodiment of the present invention.

FIG. 12 shows a cross-sectional view 1200 of the FIG. 11 structure following filling gaps in the FIG. 11 structure with oxide 130. The oxide 130, as shown, may completely cover the FIG. 11 structure, having a vertical thickness (in direction Y-Y') measured from a top of the encapsulation layer 128 formed over the nitride hard mask 112 ranging from 30 nm to 100 nm. The oxide 130 may be formed of a flowable oxide, using a coating plus anneal process.

Figure 13:
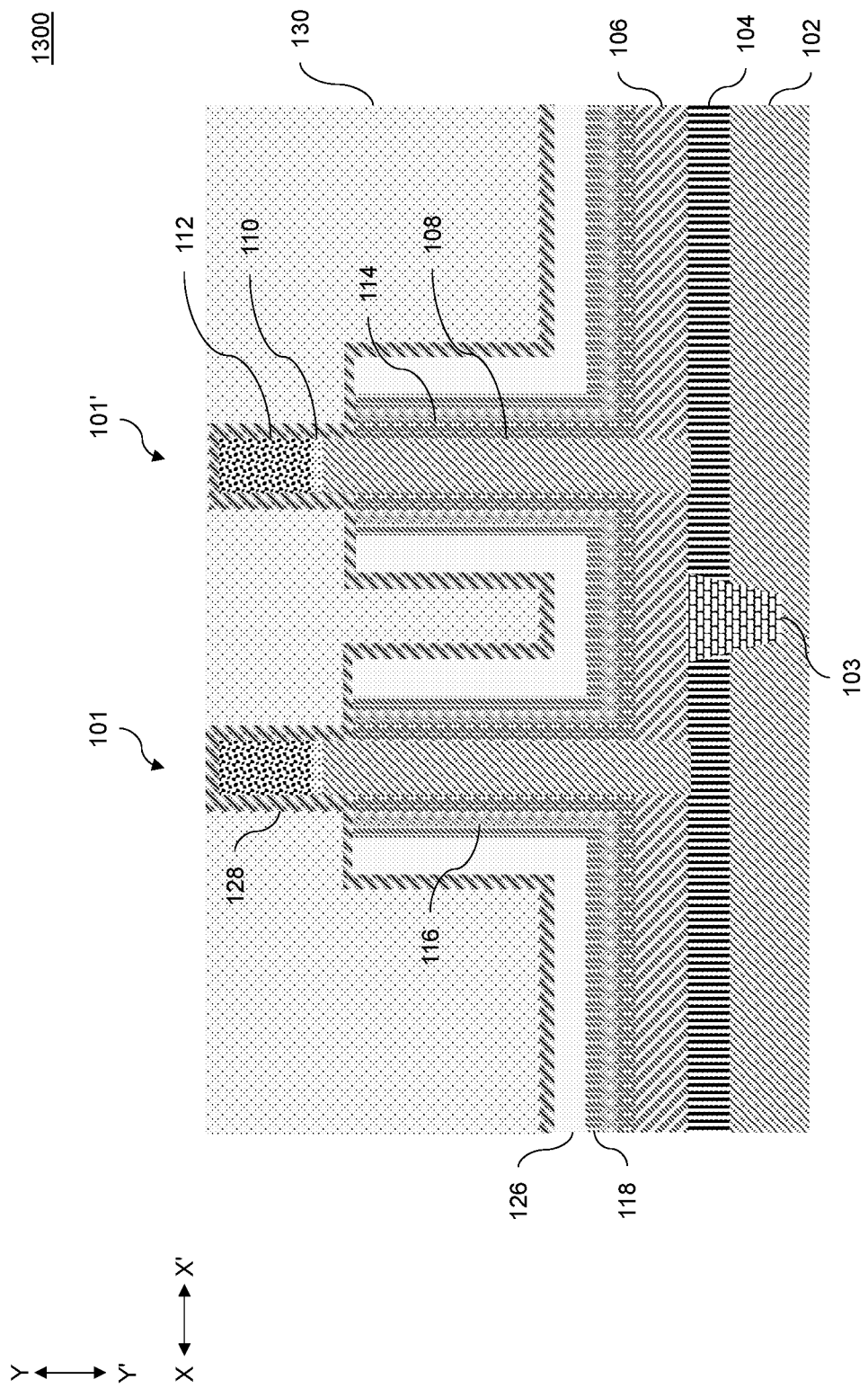
FIG. 13 depicts a cross-sectional view of the FIG. 12 structure following chemical mechanical planarization of the oxide, according to an embodiment of the present invention.

FIG. 13 shows a cross-sectional view 1300 of the FIG. 12 structure following chemical mechanical planarization (CMP) to recess the oxide 130, with the CMP stopping on the top surface of the encapsulation layer 128 formed over the nitride hard mask 112.

Figure 14:
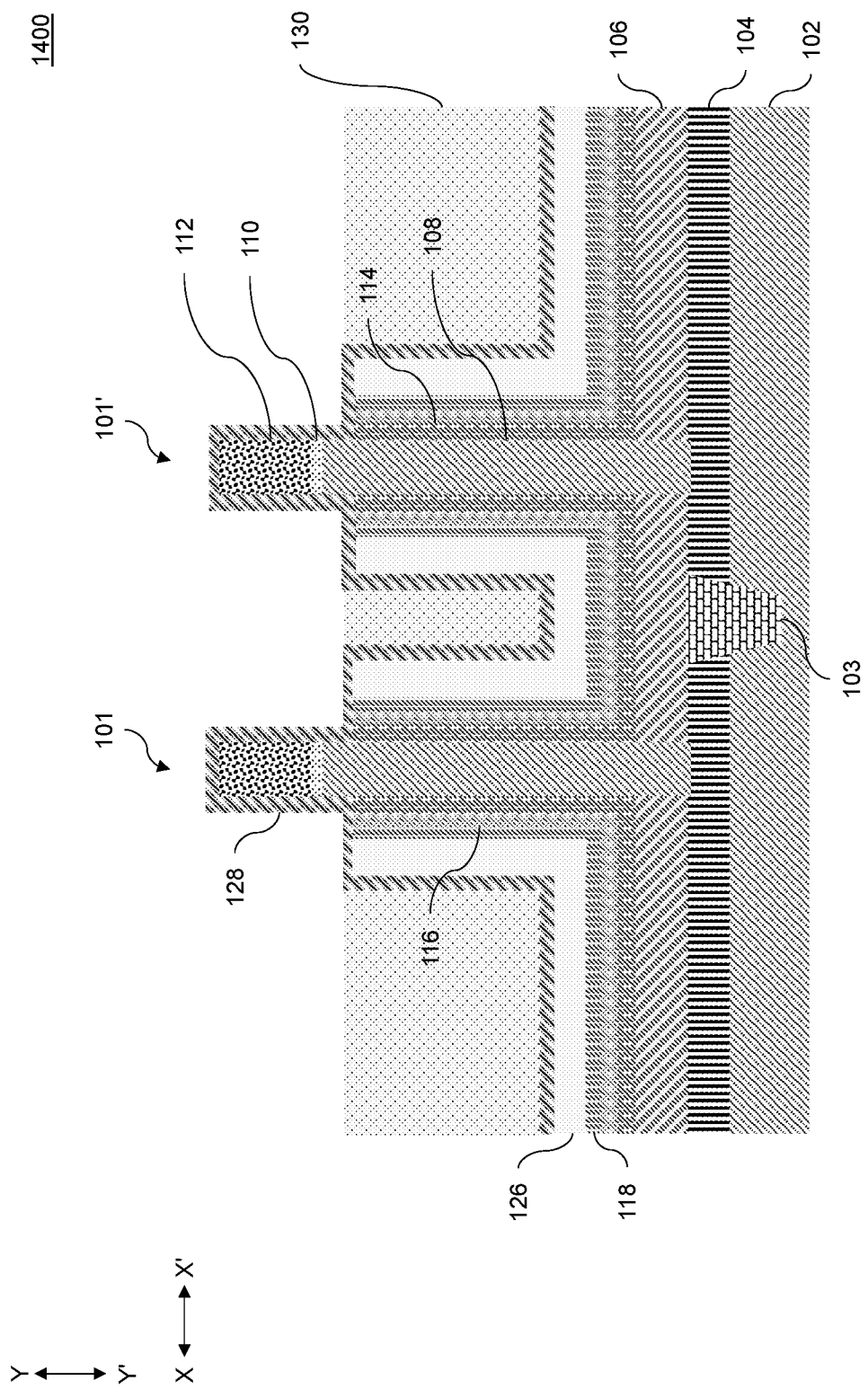
FIG. 14 depicts a cross-sectional view of the FIG. 13 structure following recess of the oxide, according to an embodiment of the present invention.

FIG. 14 shows a cross-sectional view 1400 of the FIG. 13 structure following recess of the oxide 130 to a top surface of the encapsulation layer 128 formed over the silicide 126.

The recess of oxide 130 may utilize a chemical oxide removal (COR) process, a silicon cobalt nickel (SiCoNi) selective etchant, etc.

Figure 15:
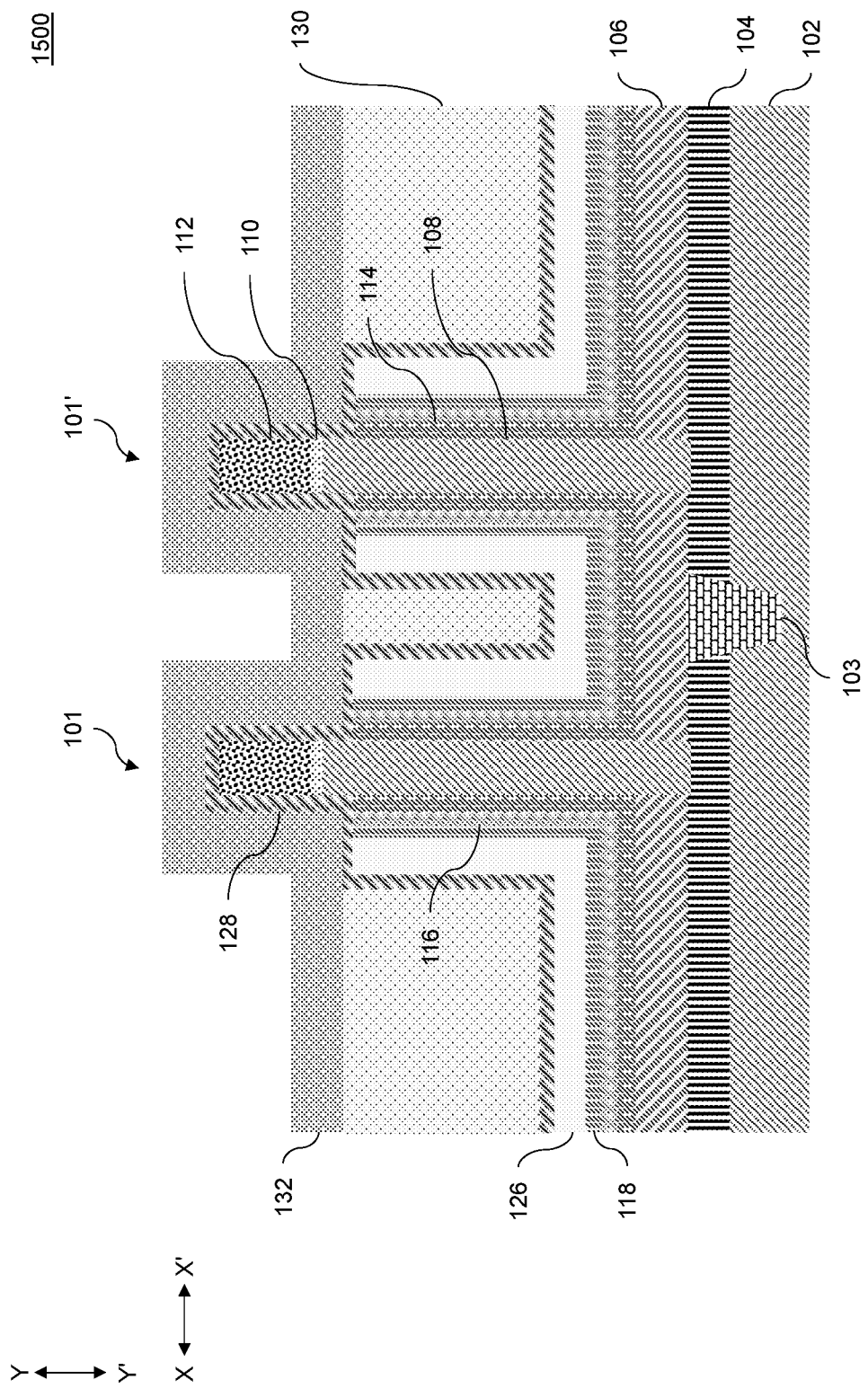
FIG. 15 depicts a cross-sectional view of the FIG. 14 structure following deposition of a nitride, according to an embodiment of the present invention.

FIG. 15 shows a cross-sectional view 1500 of the FIG. 14 structure following deposition of a top nitride layer 132. The top nitride layer 132 may have a uniform thickness (e.g., in both direction X-X' and direction Y-Y') ranging from 10 nm to 30 nm. The top nitride layer 132 may be formed of SiN, although other suitable materials such as SiOC and SiCN may be used. The top nitride layer 132 may be formed using ALD or ionized radical assistance deposition. As will be described in further detail below, the top nitride layer 132 is used in forming a top spacer hard mask (HM).

Figure 16:
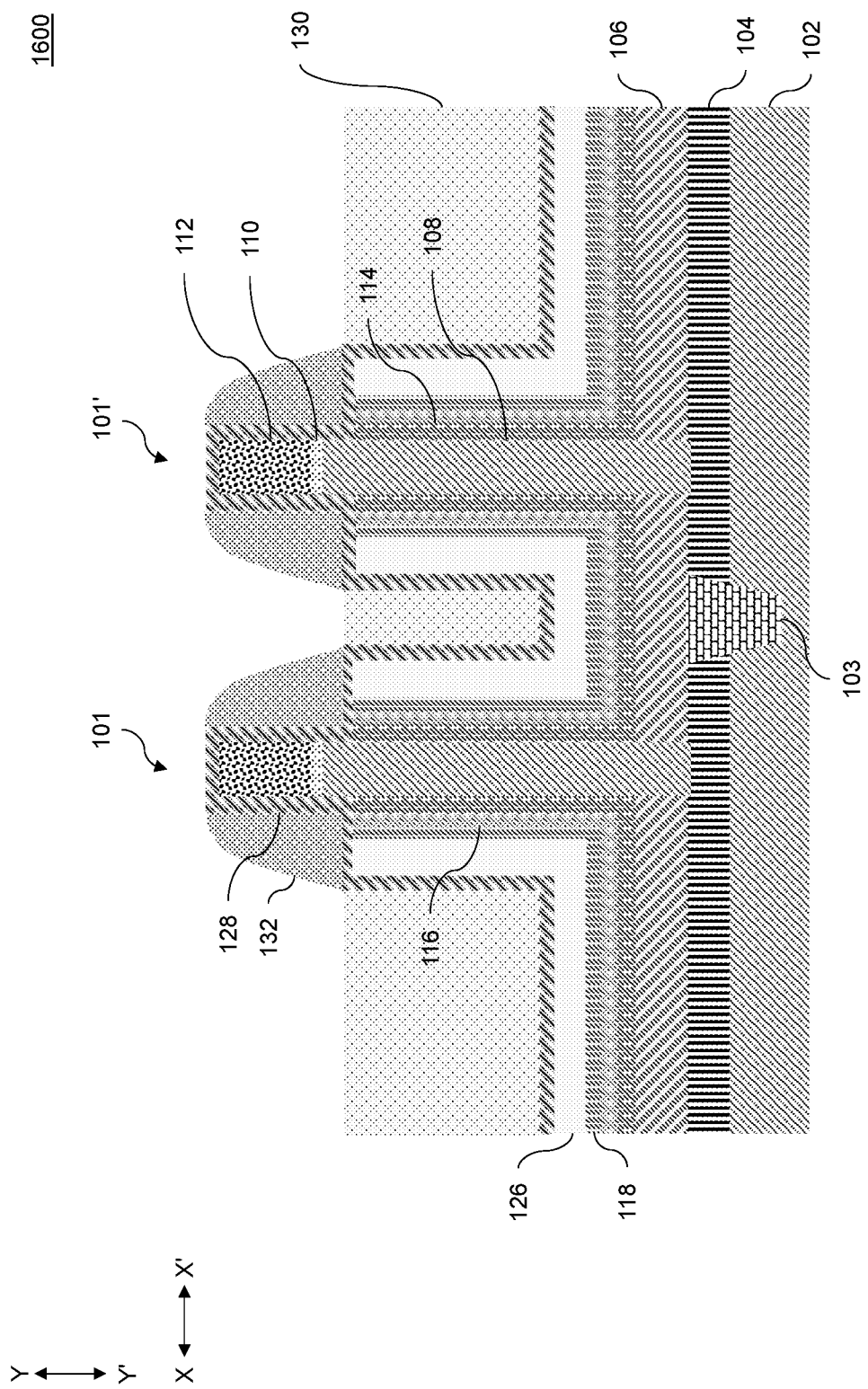
FIG. 16 depicts a cross-sectional view of the FIG. 15 structure following etching the nitride to form a spacer hard mask, according to an embodiment of the present invention.

FIG. 16 shows a cross-sectional view 1600 of the FIG. 15 structure following etching of the top nitride layer 132 to form the top spacer HM. The top nitride layer 132 may be etched using reactive-ion etching (RIE).

Figure 17:
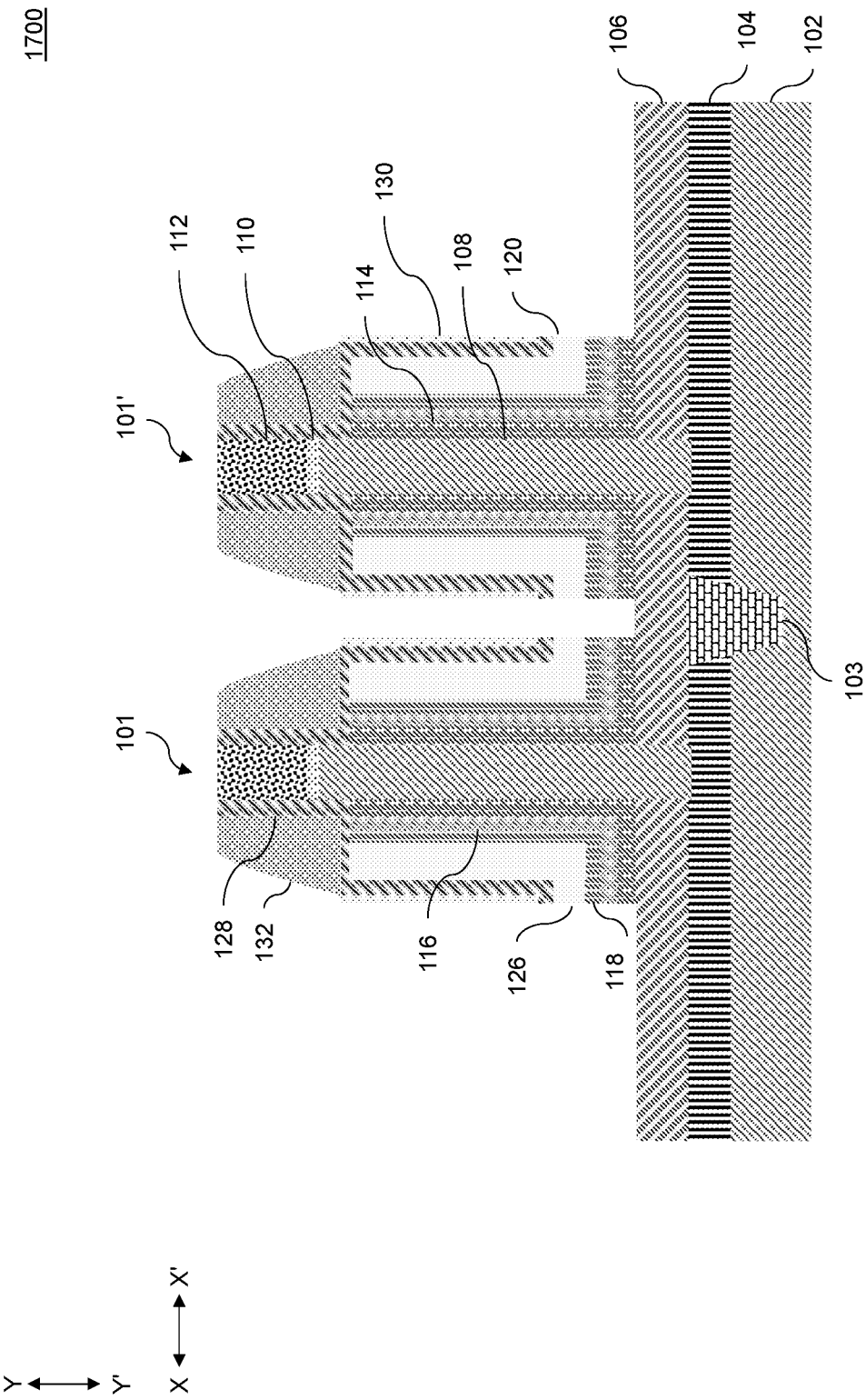
FIG. 17 depicts a cross-sectional view of the FIG. 16 structure following etching of the oxide, nitride and gate metal, according to an embodiment of the present invention.

FIG. 17 shows a cross-sectional view 1700 of the FIG. 16 structure following etching of oxide, nitride and gate metal. This etching, which may utilize RIE, removes portions of the oxide 130, top nitride layer 132, encapsulation layer 128, silicide 126, oxide 130, top nitride layer 132, encapsulation layer 128, silicon layer 118, metal gate layer 116, and HK dielectric layer 114 that are not covered by the top spacer HM as illustrated in FIG. 17. As a result, the FIG. 17 structure provides isolated gates for the NFET and PFET in the resulting structure, including gate electrodes formed from the remaining portions of the metal gate layer 116, silicon layer 118 and silicide layer 126.

Figure 18:
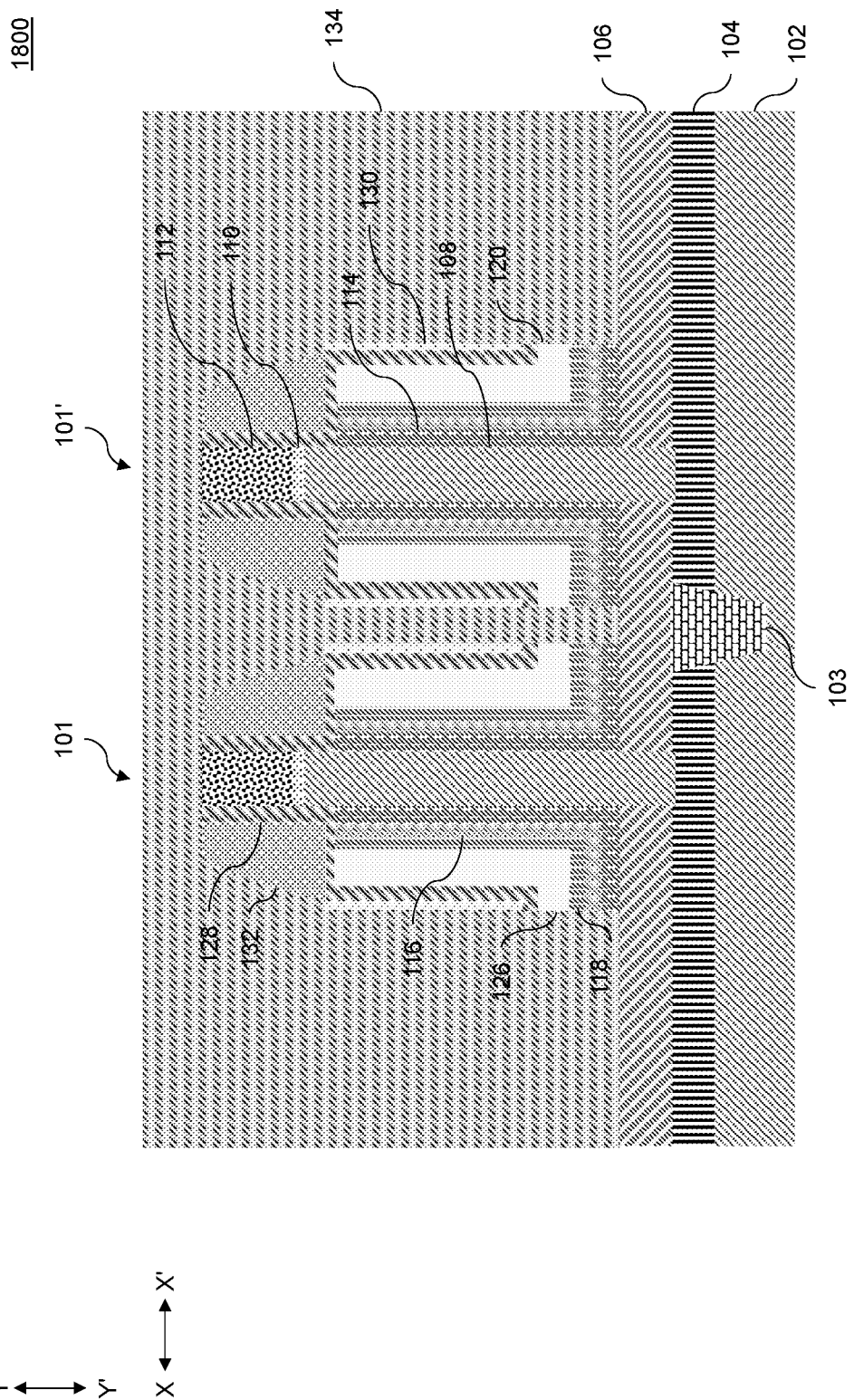
FIG. 18 depicts a cross-sectional view of the FIG. 17 structure following an oxide fill, according to an embodiment of the present invention.

FIG. 18 shows a cross-sectional view 1800 of the FIG. 17 structure following fill with oxide 134. The oxide 134 may be formed of flowable CVD (FCVD) oxide. As shown, the oxide 134 encapsulates the structure, having a vertical thickness (in direction Y-Y') above the top of the nitride hard mask 112 ranging from 10 nm to 100 nm. For encapsulation, a SiN layer may be used to prevent the coronational impact on the gate at the bottom gate.

Figure 19:
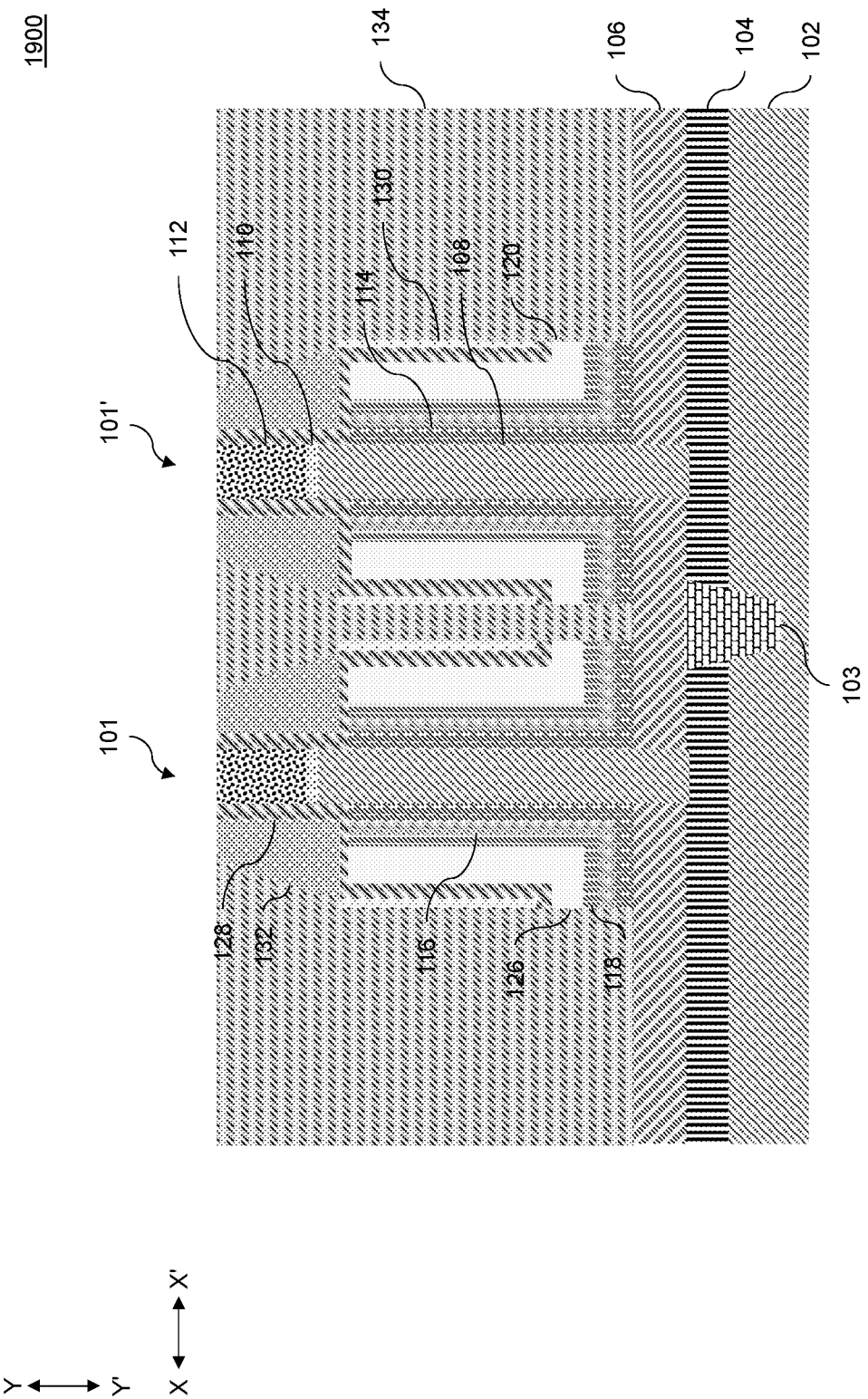
FIG. 19 depicts a cross-sectional view of the FIG. 18 structure following chemical mechanical planarization of the oxide, according to an embodiment of the present invention.

FIG. 19 shows a cross-sectional view 1900 of the FIG. 18 structure following CMP of the oxide 134 to stop at the top of the nitride hard mask 112.

Figure 20:
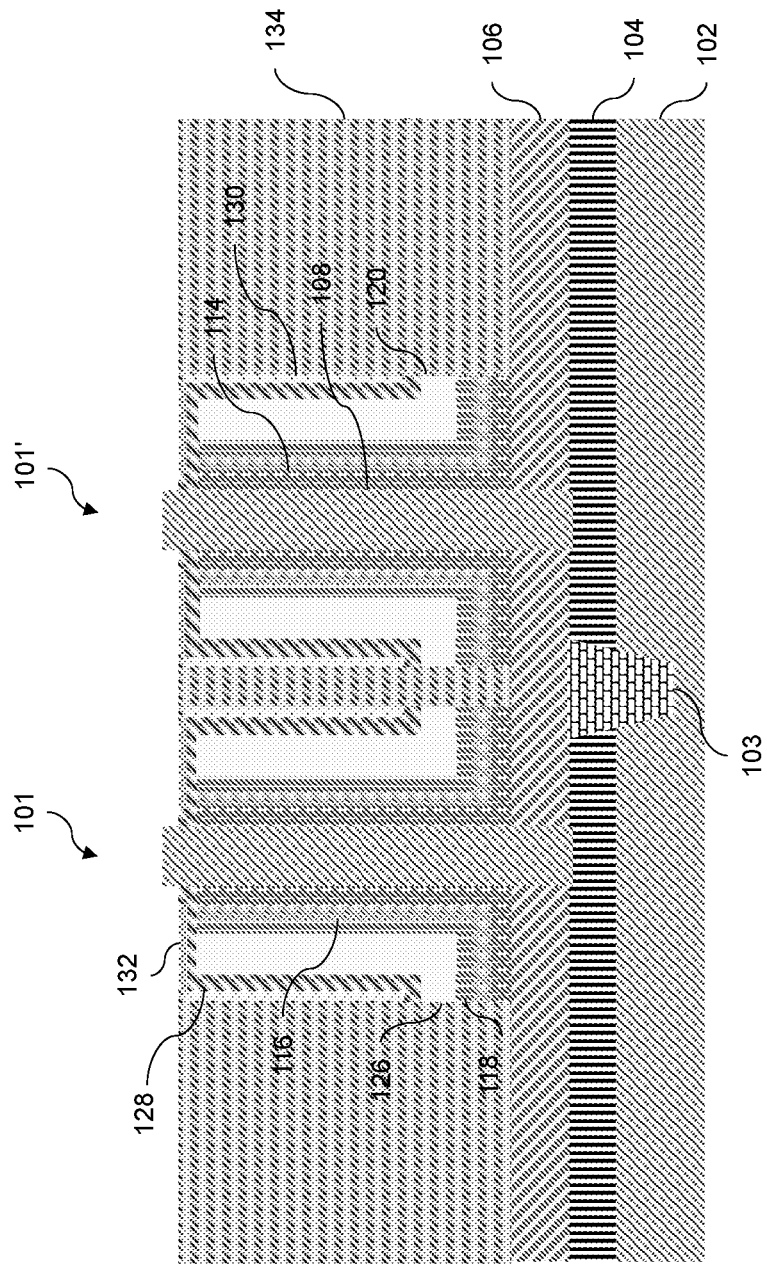
FIG. 20 depicts a cross-sectional view of the FIG. 19 structure following recess of the oxide and nitride.

FIG. 20 shows a cross-sectional view 2000 of the FIG. 19 structure following recess of the oxide 134, top nitride layer 132, oxide layer 110 and nitride hard mask 112. This recess exposes portions of the channels 108. In some embodiments the recess exposes a vertical portion (in direction Y-Y') of the channels 108 ranging from 2 nm to 15 nm. The recess of oxide 134, top nitride layer 132, oxide layer 110 and nitride hard mask 112 may be achieved using a non-selective RIE between nitride and oxide, so as to expose portions of the channels 108 for top source/drain epitaxial growth as described below.

Figure 21:
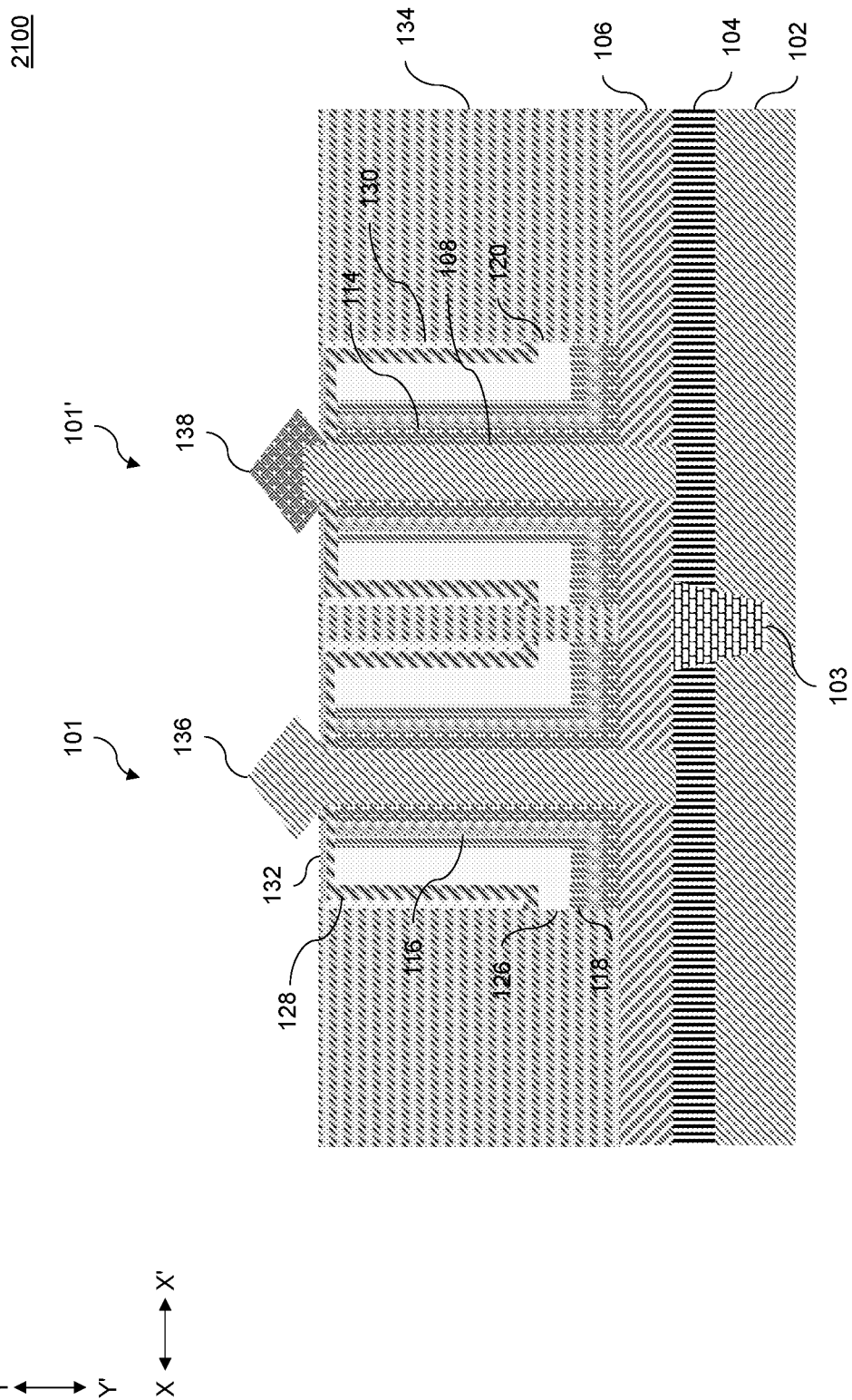
FIG. 21 depicts a cross-sectional view of the FIG. 20 structure following epitaxial growth, according to an embodiment of the present invention.

FIG. 21 shows a cross-sectional view of the FIG. 20 structure following epitaxial growth, forming an NFET source/drain 136 on the channel 108 for NFET 101, and forming a PFET source/drain 138 on the channel 108 for PFET 101'. A SiN or other capping layer may be used to grow the NFET source/drain 136 and PFET source/drain 138, such as by patterning a capping layer over the channel 108 for NFET 101 while the PFET source/drain 138 is epitaxially grown and forming a capping layer over the channel 108 for PFET 101' while the NFET source/drain 136 is epitaxially grown. The NFET source/drain 136 may be Si, while the PFET source/drain 138 may be formed of silicon germanium (SiGe). Other materials may be used for the NFET source/drain 136 and the PFET source/drain 138, including other combinations of group III-IV materials such as utilizing indium phosphide (InP) for the NFET source/drain 136 and indium gallium arsenide (InGaAs) for the PFET source/drain 138. The vertical thickness (in direction Y-Y') of the NFET source/drain 136 and the PFET source/drain 138 may each range from 3 nm to 20 nm. The horizontal thickness (in direction X-X') of the NFET source/drain 136 and the PFET source/drain 138 may each range from 3 nm to 20 nm.

Figure 22:
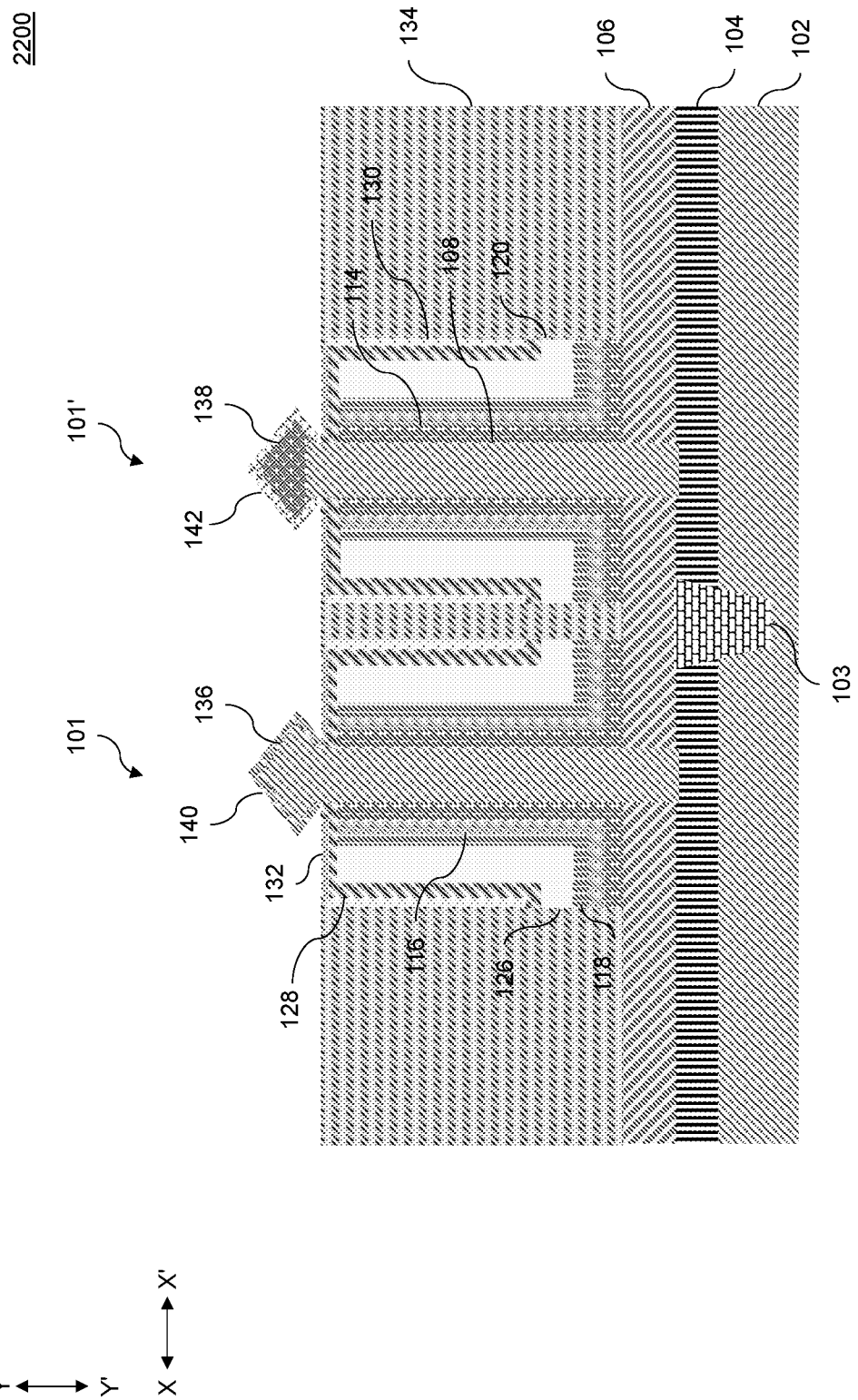
FIG. 22 depicts a cross-sectional view of the FIG. 21 structure following formation of top source/drain silicides, according to an embodiment of the present invention.

FIG. 22 shows a cross-sectional view 2200 of the FIG. 21 structure following formation of top source/drain silicides, including NFET source/drain silicide 140 and PFET source/drain silicide 142. The NFET source/drain silicide 140 and the PFET source/drain silicide 142 may be formed by depositing pure metal like Ti, Co, Ni, and W and metal cap like TiN and then followed by anneal like laser anneal, spike anneal and soak anneal. The NFET source/drain silicide 140 and the PFET source/drain silicide 142 may each have a uniform thickness (e.g., in both direction X-X' and direction Y-Y') ranging from 1 nm to 10 nm.

Figure 23:
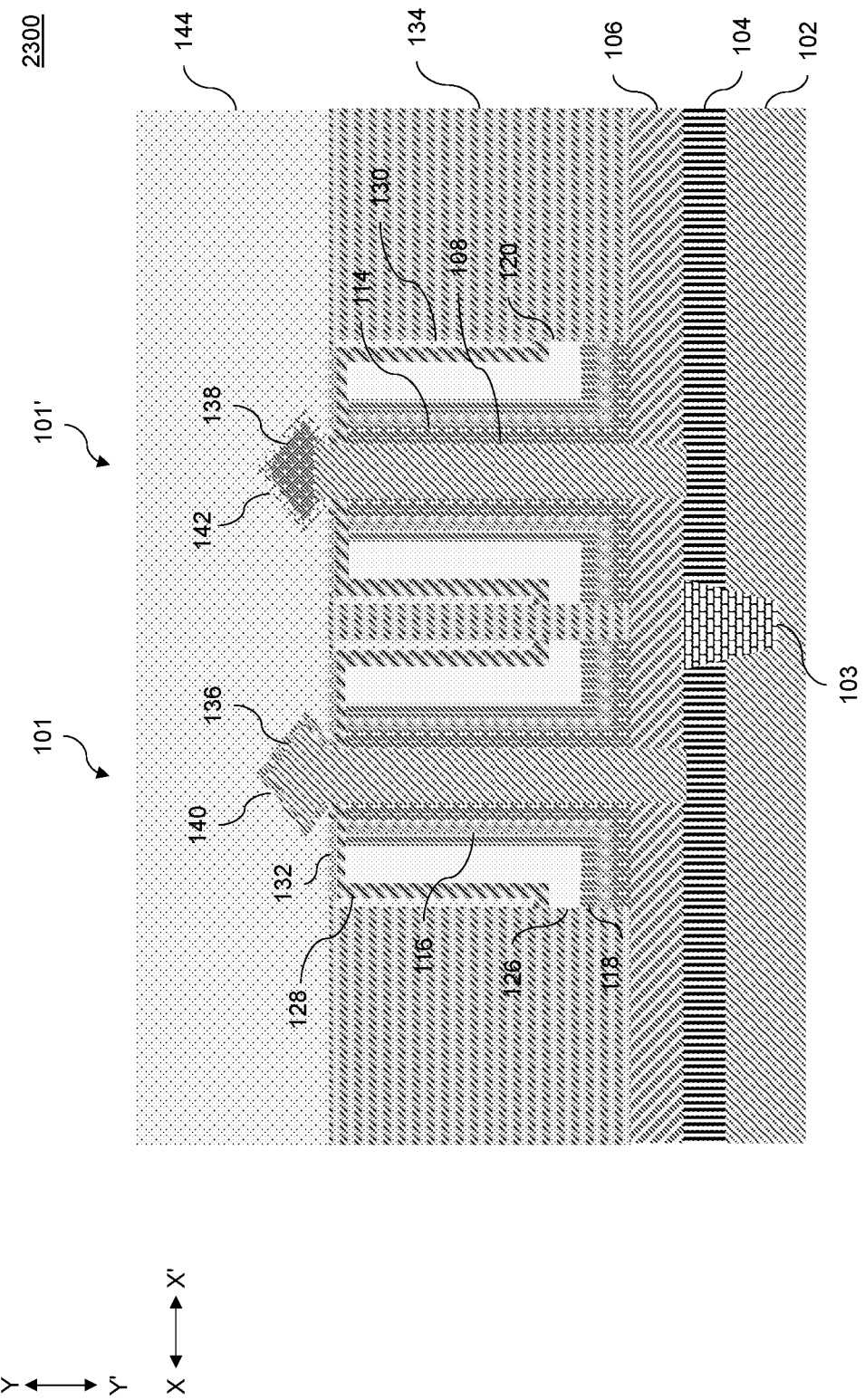
FIG. 23 depicts a cross-sectional view of the FIG. 22 structure following deposition of an oxide, according to an embodiment of the present invention.

FIG. 23 depicts a cross-sectional view 2300 of the FIG. 22 structure following deposition of an oxide 144. As shown, the oxide 144 covers the NFET source/drain 136, the NFET source/drain silicide 140, the PFET source/drain 138 and the PFET source/drain silicide 142. The oxide 144 may be formed of $SiO_2$, using CVD, plasma-enhanced CVD (PECVD) and/or ALD processes.

Figure 24:
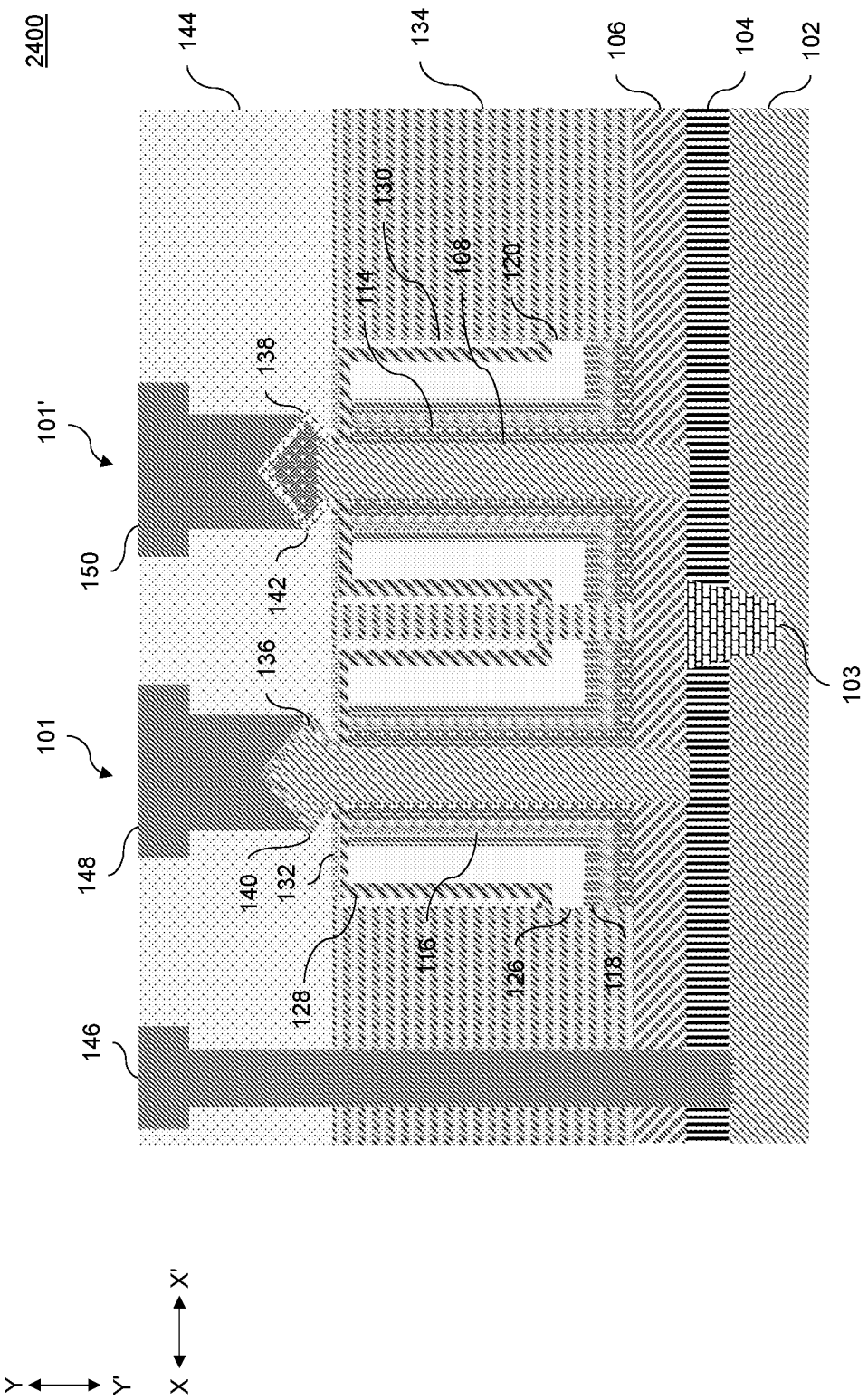
FIG. 24 depicts a cross-sectional view of the FIG. 23 structure following formation of contacts and interconnects, according to an embodiment of the present invention.

FIG. 24 depicts a cross-sectional view 2400 of the FIG. 23 structure following formation of interconnect 146 and contacts 148 and 150. Interconnect 146 and contacts 148 and 150 are formed by patterning and etching the oxide 144, oxide 134 and/or spacer 106, such as using lithography techniques. Material for the interconnects and contacts is then deposited. The interconnect 146 may be formed of W, Co or copper (Cu). The NFET top source/drain contact 148 may be formed of W or Co. The PFET top source/drain contact 150 may be formed of W or Co.

As shown, interconnect 146 contacts the bottom contact 104. The interconnect 146 may have horizontal thickness (in direction X-X') which is uniform through the bottom contact 104, spacer 106, oxide 134 and a portion of the oxide 144. As illustrated, a portion of the interconnect 146 near to the top surface of the oxide 144 may have a larger horizontal thickness (in direction X-X') ranging from 2 nm to 10 nm.

As shown, NFET top source/drain contact 148 contacts the NFET source/drain silicide 140 and the PFET source/drain contact 150 contacts the PFET source/drain silicide 142. Each of the NFET top source/drain contact 148 and the PFET top source/drain contact 150 has a first horizontal thickness (in direction X-X') matching that of the NFET source/drain silicide 140 and the PFET source/drain silicide 142, respectively. A portion of each of the NFET top source/drain contact 148 and the PFET top source/drain contact 150 near to the top surface of the oxide 144 may have a larger horizontal thickness (in direction X-X') ranging from 2 nm to 10 nm.

Figure 25:
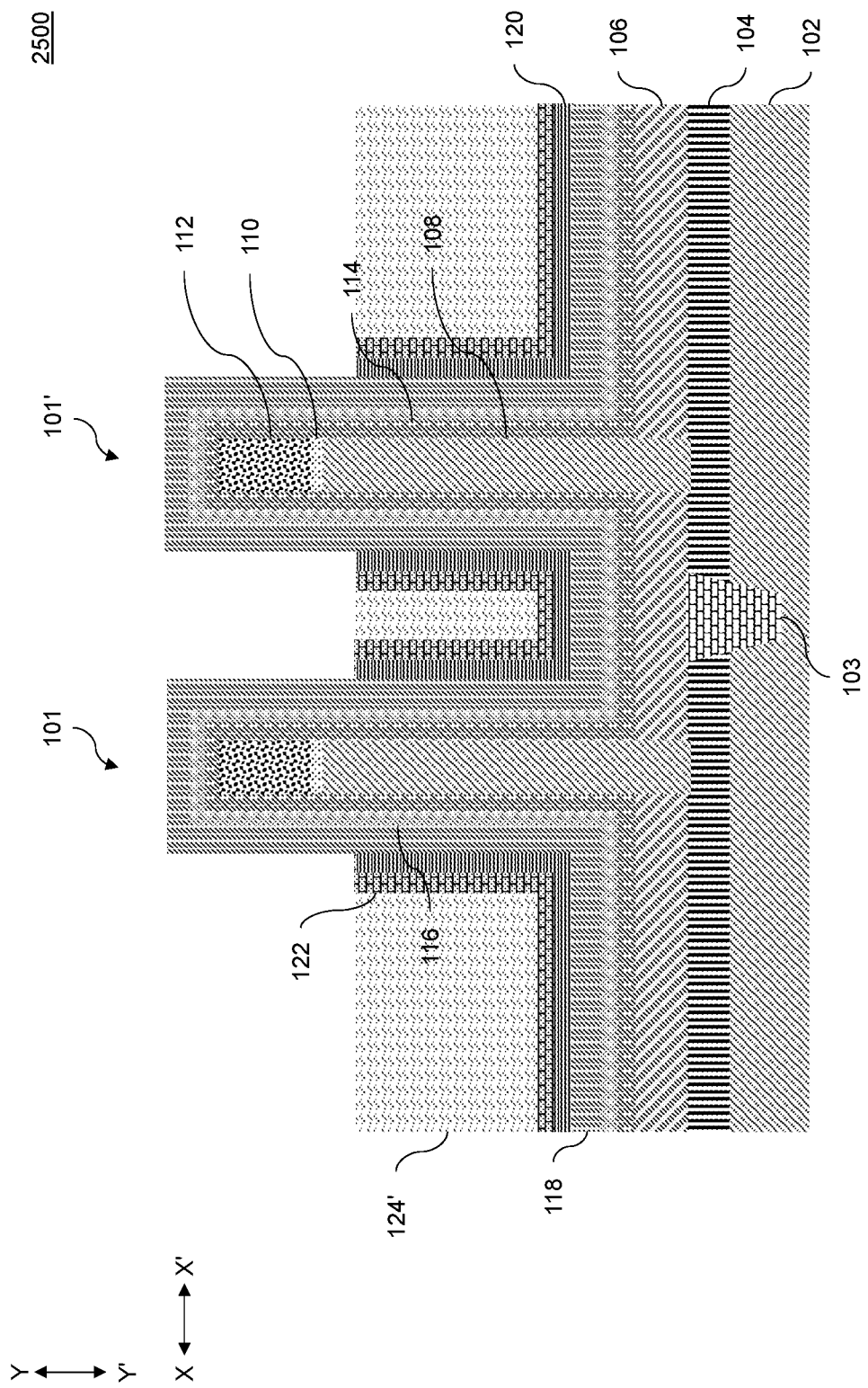
FIG. 25 depicts a cross-sectional view of the FIG. 4 structure following formation of a sacrificial layer, according to an embodiment of the present invention.

As discussed above, in some embodiments the steps described with respect to FIGS. 5-10 may be replaced with the steps described below in conjunction with FIGS. 25-29. FIG. 25 shows a cross-sectional view 2500 of the FIG. 4 structure following formation of a sacrificial material 124'. Whereas the steps described above with respect to FIGS. 5-10 utilize OPL 124, the steps in FIGS. 25-29 utilize the sacrificial layer 124', which may be an oxide-like material. Similar processing as described above with respect to FIG. 5 may be used to recess the sacrificial layer 124' along with metal layers 120 and 122. In one embodiment, the sacrificial layer 124' can be recessed by a chemical oxide removal (COR) process, a silicon cobalt nickel (SiCoNi) selective etchant, etc.

Figure 26:
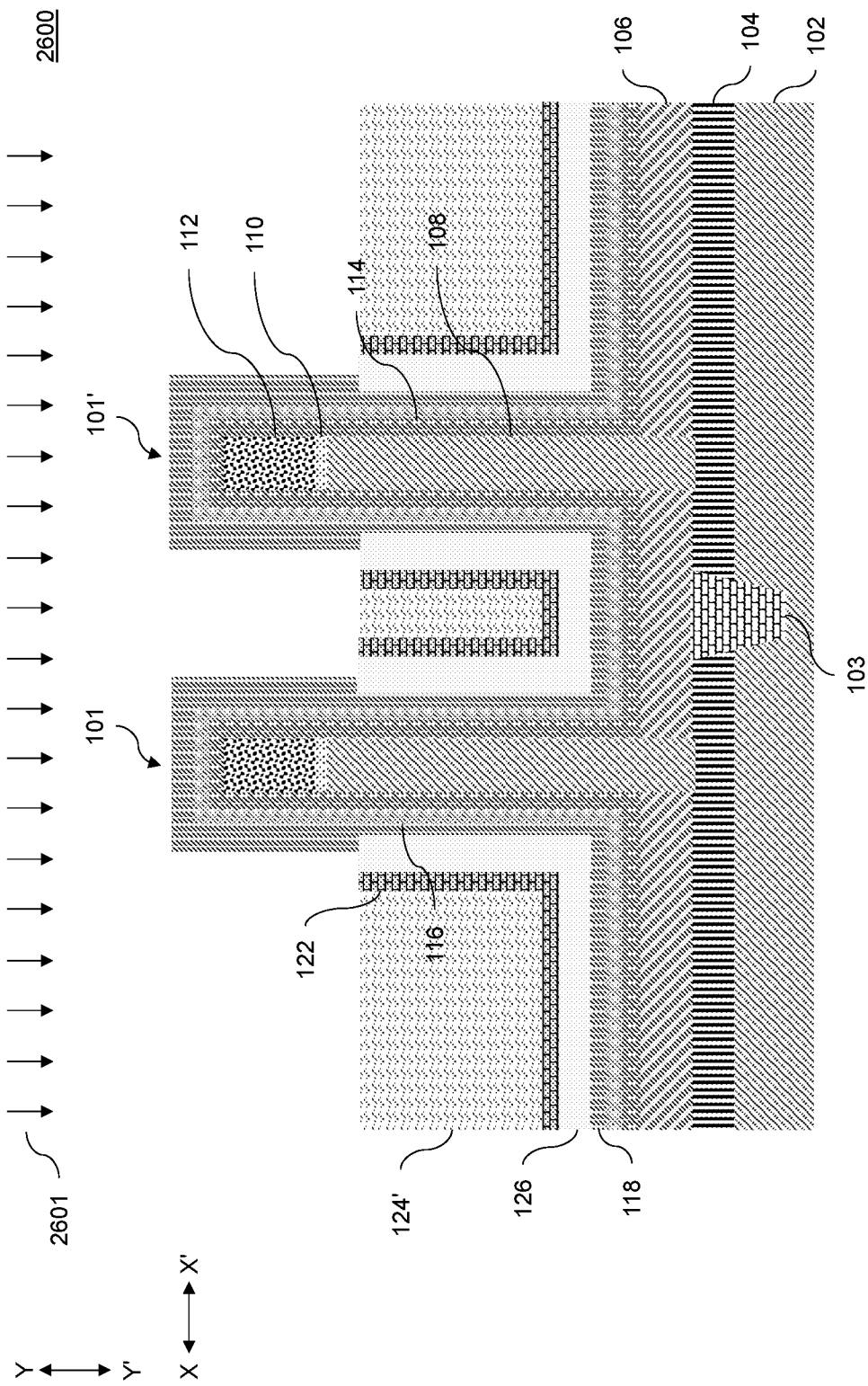
FIG. 26 depicts a cross-sectional view of the FIG. 25 structure following formation of a silicide, according to an embodiment of the present invention.

FIG. 26 shows a cross-sectional view 2600 of the FIG. 25 structure following formation of silicide 126 via an anneal process 2601. The anneal process 2601 may be similar to the anneal described above with respect to FIG. 7.

Figure 27:
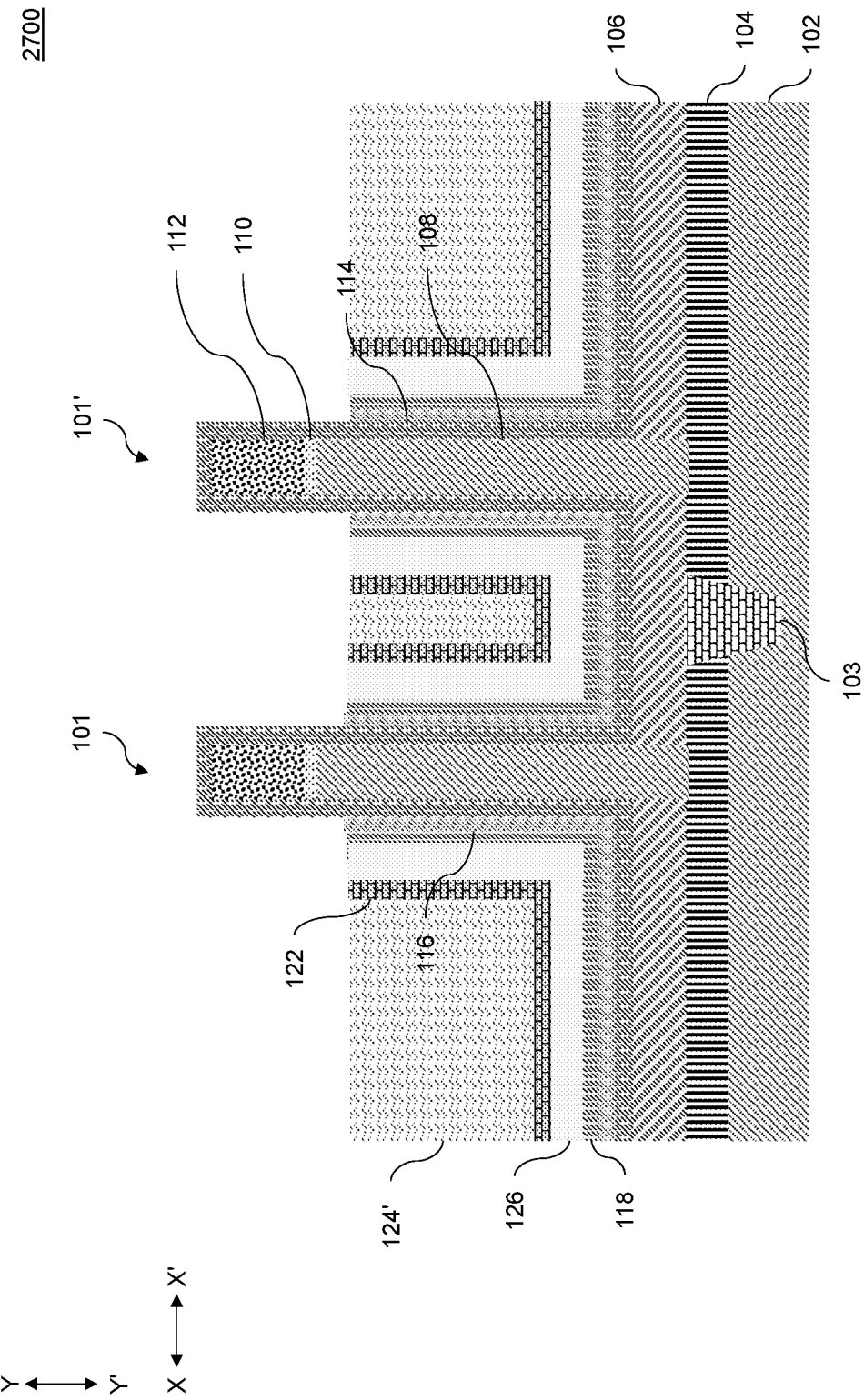
FIG. 27 depicts a cross-sectional view of the FIG. 26 structure following removal of the silicon layer, according to an embodiment of the present invention.

FIG. 27 shows a cross-sectional view 2700 of the FIG. 26 structure following removal of the silicon layer 118 above the silicide 126 (e.g., the silicon layer 118 in the second region described above). Selective RIE, such as Si-selective RIE, may be used to remove the silicon layer 118 above the silicide 126. The metal gate layer 116 above the silicide 126 (e.g., the metal gate layer 116 in the second region described above) is also removed using a wets like hot standard clean 1 (SC1) or RIE process.

Figure 28:
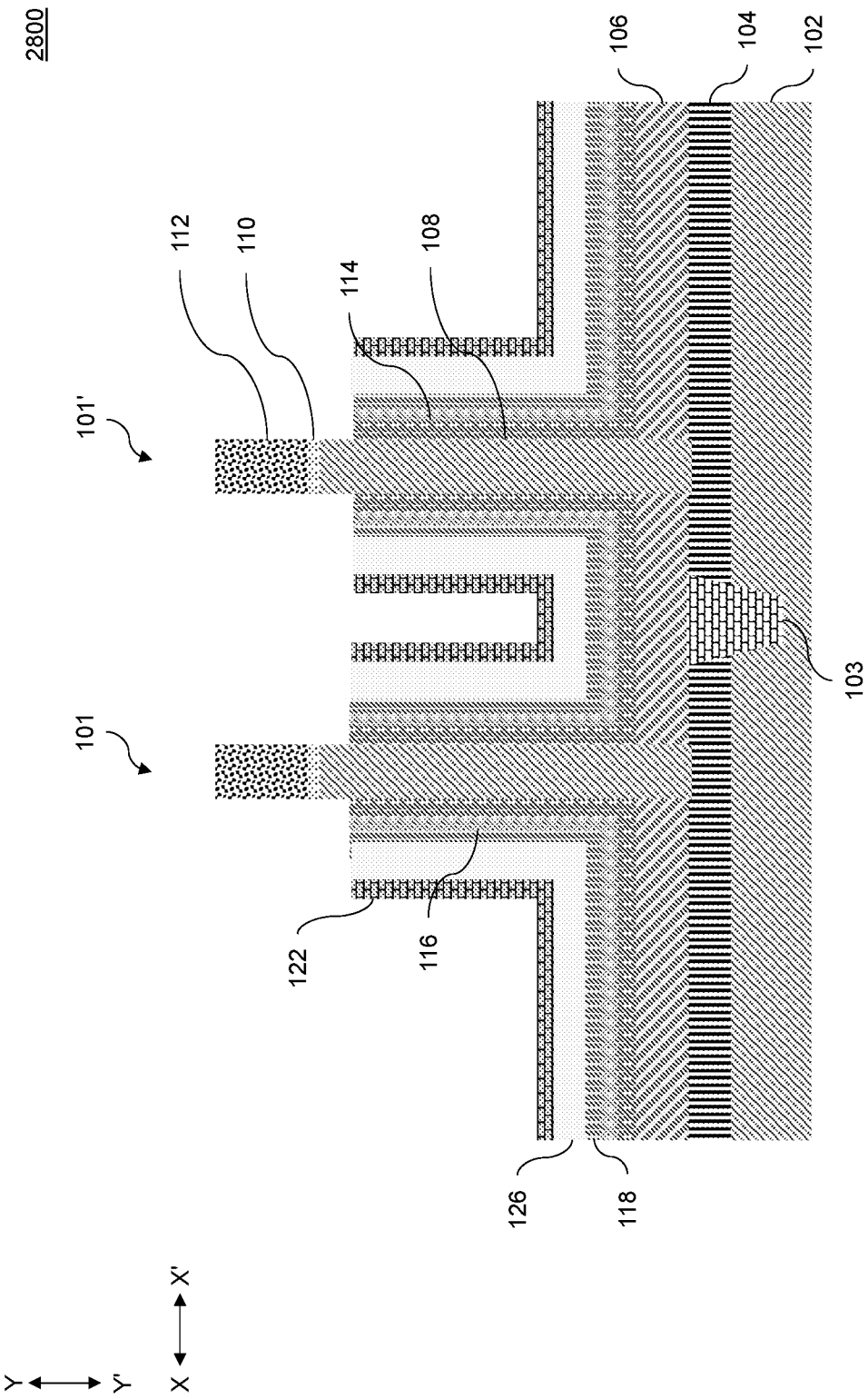
FIG. 28 depicts a cross-sectional view of the FIG. 27 structure following removal of the sacrificial layer, according to an embodiment of the present invention.

FIG. 28 shows a cross-sectional view 2800 of the FIG. 27 structure following removal of the sacrificial layer 124' and the HK dielectric layer 114 above the silicide 126 (e.g., the HK dielectric layer 114 in the second region described above). A stripping process may be used in this step. Advantageously, when the HK dielectric layer 114 above the silicide 126 is stripped, the silicide 126 is protected by unreacted metal so that the silicide 126 is not exposed to the strip process. This can lead to a more stable integration process relative to the processing described above with respect to FIGS. 7-10.

Figure 29:
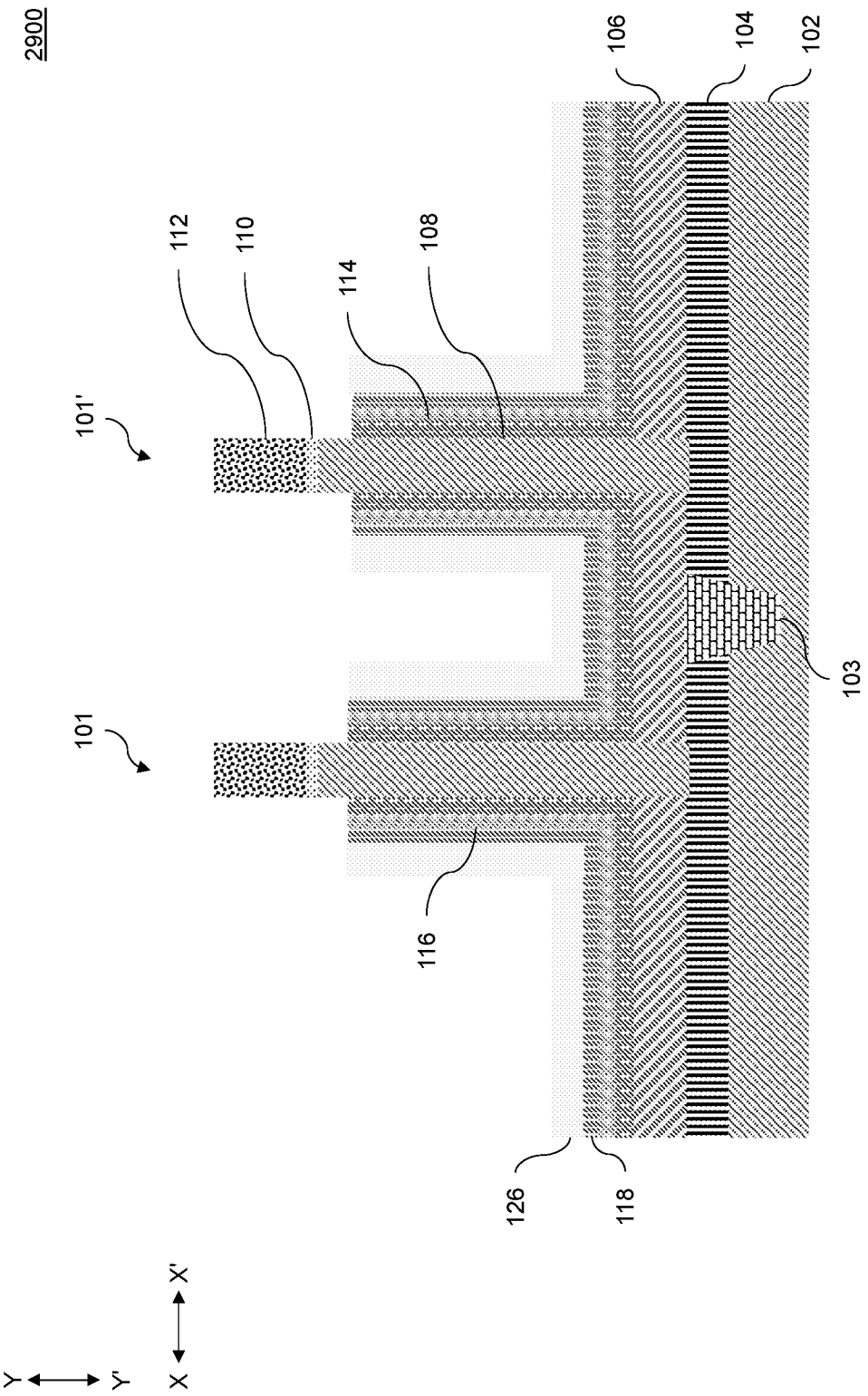
FIG. 29 depicts a cross-sectional view of the FIG. 28 structure following removal of the metal layer, according to an embodiment of the present invention.

FIG. 29 shows a cross-sectional view 2900 of the FIG. 28 structure following removal of the metal layer 122. The metal layer 122 may be removed using a stripping process. Processing may then continue as described above with respect to FIGS. 11-24.

In some embodiments, a method of forming a semiconductor structure comprises forming an interfacial layer surrounding at least one channel stack, forming a high-k dielectric layer surrounding the interfacial layer, forming a metal gate layer surrounding the high-k dielectric layer, forming a silicon layer over the metal gate layer, forming at least one additional metal layer over the silicon layer, and performing silicidation to transform at least a portion of the at least one additional metal layer and at least a portion of the silicon layer into a silicide layer. The metal gate layer, the silicon layer and the silicide layer form at least one gate electrode for a VTFET.

The at least one channel stack may comprise a first channel stack and at least a second channel stack, the first channel stack forming a portion of an NFET and the second channel stack forming a portion of a PFET. A first source/drain region is epitaxially grown over the first channel stack and a second source/drain is epitaxially grown over the second channel stack. The first source/drain region comprises a first material and the second source/drain region comprises a second material different than the first material. The method may further comprise performing silicidation to form a first silicide region in the first source/drain region and a second silicide region in the second source/drain region.

In some embodiments, the metal gate layer and the at least one additional metal layer comprise titanium and the silicon layer comprises amorphous silicon.

In some embodiments, the silicon layer provides an oxygen barrier layer preventing an increase in $T_{inv}$ resulting from oxygen diffusion into the metal gate layer.

The at least one channel stack may comprise two or more channel stacks, and the method may further comprise forming the substrate, forming a bottom contact over the substrate, forming the two or more channel stacks over two or more different portions of the bottom contact, each of the two or more channel stacks comprising a channel, an oxide layer formed over the channel and a nitride layer formed over the oxide layer, forming a bottom spacer over the bottom contact between the two or more channels of the two or more channel stacks, and forming the dielectric layer over a top surface of the bottom spacer and surrounding the two or more channel stacks, the dielectric layer comprising a high-k dielectric layer. The method may further comprise forming the metal gate layer by depositing the metal gate layer over the dielectric layer, forming the silicon layer by depositing the silicon layer over the metal gate layer, and forming the at least one additional metal layer by depositing a first additional metal layer over the silicon layer and depositing a second additional metal layer over the first additional metal layer.

In some embodiments, the method further comprises forming a sacrificial layer over the second additional metal layer encapsulating the two or more channel stacks and recessing the sacrificial layer, the first additional metal layer and the second additional metal layer to form first and second regions of the silicon layer, the metal gate layer, the dielectric layer and the two or more channel stacks, the first regions being surrounded by the recessed sacrificial layer, the recessed first additional metal layer and the recessed second additional metal layer, the second regions being exposed by recessing the sacrificial layer, the first additional metal layer and the second additional metal layer. Performing silicidation may comprise performing an anneal to transform at least a portion of the first region of the silicon layer and the recessed first additional metal layer into the silicide layer.

The method may further comprise stripping the sacrificial layer, the second additional metal layer and the second regions of the silicon layer, the metal gate layer and the dielectric layer exposing portions of the two or more channel stacks, and depositing an encapsulation layer over the silicide layer, the first regions of the silicon layer and the dielectric layer, and the exposed portions of the two or more channel stacks. In some embodiments, the sacrificial layer comprises an OPL and the OPL is stripped prior to performing silicidation. In other embodiments, the sacrificial layer comprises an oxide, and wherein the silicidation is performed prior to stripping the sacrificial layer.

In some embodiments, the method further comprises forming a first additional oxide layer surrounding the encapsulation layer, performing chemical mechanical planarization of the first additional oxide layer stopping on the encapsulation layer formed over tops of the two or more channel stacks, recessing the first additional oxide layer to expose the encapsulation layer formed on a top surface of the silicide layer surrounding the two or more channel stacks, and depositing an additional nitride layer over the recessed first additional oxide layer and exposed portions of the encapsulation layer. The method may further comprise etching the additional nitride layer to form a top spacer hard mask surrounding portions of the two or more channel stacks above the recessed first additional oxide layer, wherein the top spacer hard mask exposes portions of the encapsulation layer formed over the tops of the two or more channel stacks. The method may further comprise etching the exposed portions of the encapsulation layer formed over the tops of the two or more channel stacks to expose the nitride layers of each of the two or more channel stacks, wherein etching the exposed portions of the encapsulation layer also etches portions of the recessed first additional oxide layer, the silicide layer, the silicon layer, the gate metal layer, and the dielectric exposed by the top spacer hard mask. The method may further comprise filling a second additional oxide layer to surround the two or more channel stacks and remaining portions of the recessed first additional oxide layer, the dielectric layer, the gate metal layer, the silicon layer, the silicide layer and the exposed nitride layers of each of the two or more channel stacks. The method may further comprise performing chemical mechanical planarization of the second additional oxide layer stopping on the exposed nitride layers of each of the two or more channel stacks and recessing the second additional oxide layer, the nitride layers of each of the two or more channel stacks and the oxide layers of each of the two or more channel stacks to expose portions of the channels in each of the two or more channel stacks.

In some embodiments, the method further comprises epitaxially growing source/drain regions on the exposed portions of the channels in each of the two or more channel stacks, wherein a first source/drain region for an NFET is epitaxially grown over an exposed portion of the channel in a first one of the two or more channel stacks and a second source/drain region for a PFET is epitaxially grown over an exposed portion of the channel in a second one of the two or more channel stacks, the first source/drain region comprising a first material and the second source/drain region comprising a second material different than the first material. The method may further comprise forming a first silicide region in the first source/drain region and forming a second silicide region in the second source/drain region, depositing a third additional oxide layer surrounding the first source/drain region and the second source/drain region, patterning the third additional oxide layer to form a first exposed portion to the bottom contact layer, a second exposed portion to the first source/drain region, and a third exposed portion to the second source/drain region, and forming an interconnect to the bottom contact layer in the first exposed portion, a first contact to the first source/drain region in the second exposed portion, and a second contact to the second source/drain region in the third exposed portion.

In some embodiments, a semiconductor structure comprises an interfacial layer surrounding at least one channel stack, a high-k dielectric layer surrounding the interfacial layer above the channel stack, a metal gate layer surrounding the high-k dielectric layer, a silicon layer surrounding the metal gate layer, and a silicide layer surrounding the silicon layer. The metal gate layer, the silicon layer and the silicide layer provide a gate electrode for a VTFET. The at least one channel stack may comprise a first channel stack and at least a second channel stack. The semiconductor structure may further comprise a first source/drain region disposed over a first channel of the first channel stack, the first channel providing a portion of an NFET and a second source/drain region disposed over a second channel of the second channel stack, the second channel providing a portion of a PFET. The first source/drain region comprises a first material and the second source/drain region comprises a second material different than the first material. The first source/drain region comprises a first silicide region and the second source/drain region comprises a second silicide region.

In some embodiments, an integrated circuit comprises a VTFET. The VTFET comprises an interfacial layer surrounding at least one channel stack, a high-k dielectric layer surrounding the interfacial layer, a metal gate layer surrounding the high-k dielectric layer, a silicon layer surrounding the metal gate layer, and a silicide layer surrounding the silicon layer, wherein the metal gate layer, the silicon layer and the silicide layer provide a gate electrode for the VTFET. The at least one channel stack may comprise a first channel stack and at least a second channel stack. The VTFET may further comprise a first source/drain region disposed over a first channel of the first channel stack, the first channel providing a portion of an NFET, and a second source/drain region disposed over a second channel of the second channel stack, the second channel providing a portion of a PFET. The first source/drain region comprises a first material and the second source/drain region comprises a second material different than the first material. The first source/drain region comprises a first silicide region and the second source/drain region comprises a second silicide region.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

Semiconductor devices and methods for forming same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require, for example, complementary metal-oxide semiconductors (CMOSs), MOSFETs, and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A semiconductor structure, comprising:
an interfacial layer comprising a first material disposed on sidewalls of a first channel stack and a second channel stack and on a top surface of a substrate between the first channel stack and the second channel stack;
a high-k dielectric layer comprising a second material disposed on the interfacial layer above the top surface of the substrate and on sidewalls of the interfacial layer, wherein the second material is different than the first material;
a metal gate layer disposed on the high-k dielectric layer above the top surface of the substrate and on sidewalls of the high-k dielectric layer;
a silicon layer disposed on the metal gate layer above the top surface of the substrate and on sidewalls of the metal gate layer;
a silicide layer disposed on the silicon layer and configured to have an opening therein;
an oxide layer disposed in the opening;
an encapsulation layer disposed on a top surface of the first channel stack and the second channel stack and on the silicide layer; and
a nitride layer disposed on the encapsulation layer;
wherein the nitride layer is configured to expose a top surface of the encapsulation layer on the first channel stack and the second channel stack; and
wherein the metal gate layer, the silicon layer and the silicide layer provide a gate electrode for a vertical transport field-effect transistor.

2. The semiconductor structure of claim 1, wherein the interfacial layer, the high-k dielectric layer, the metal gate layer, the silicon layer and the silicide layer are configured to expose a top portion of the first channel stack and the second channel stack.

3. The semiconductor structure of claim 1, further comprising another oxide layer disposed on the nitride layer, the other oxide layer being configured to expose a top surface of the nitride layer and the top surface of the encapsulation layer on the first channel stack and the second channel stack.

4. The semiconductor structure of claim 1, wherein the first channel stack comprises a portion of a negative channel field-effect transistor and the second channel stack comprises a portion of a positive channel field-effect transistor.

5. The semiconductor structure of claim 1, further comprising a spacer layer disposed between the top surface of the substrate and the interfacial layer.

6. An integrated circuit, comprising:
a vertical transport field-effect transistor comprising:
an interfacial layer comprising a first material disposed on sidewalls of a first channel stack and a second channel stack and on a top surface of a substrate between the first channel stack and the second channel stack;
a high-k dielectric layer comprising a second material disposed on the interfacial layer above the top surface of the substrate and on sidewalls of the interfacial layer, wherein the second material is different than the first material;
a metal gate layer disposed on the high-k dielectric layer above the top surface of the substrate and on sidewalls of the high-k dielectric layer;
a silicon layer disposed on the metal gate layer above the top surface of the substrate and on sidewalls of the metal gate layer;
a silicide layer disposed on the silicon layer and configured to have an opening therein;
an oxide layer disposed in the opening;
an encapsulation layer disposed on a top surface of the first channel stack and the second channel stack and on the silicide layer; and
a nitride layer disposed on the encapsulation layer;
wherein the nitride layer is configured to expose a top surface of the encapsulation layer on the first channel stack and the second channel stack; and
wherein the metal gate layer, the silicon layer and the silicide layer provide a gate electrode for the vertical transport field-effect transistor.

7. The integrated circuit of claim 6, wherein the interfacial layer, the high-k dielectric layer, the metal gate layer, the silicon layer and the silicide layer are configured to expose a top portion of the first channel stack and the second channel stack.

8. The integrated circuit of claim 6, wherein the vertical transport field-effect transistor further comprises another oxide layer disposed on the nitride layer, the other oxide layer being configured to expose a top surface of the nitride layer and the top surface of the encapsulation layer on the first channel stack and the second channel stack.

9. The integrated circuit of claim 6, wherein the first material is silicon dioxide ($SiO_2$) or silicon oxynitride (SiON).

10. The integrated circuit of claim 9, wherein the second material is hafnium dioxide ($HfO_2$), lanthanum oxide ($La_2O_3$), zirconium oxide ($Zr_2O_3$), or aluminum oxide ($Al_2O_3$).

11. The integrated circuit of claim 6, wherein the first channel stack comprises a portion of a negative channel field-effect transistor and the second channel stack comprises a portion of a positive channel field-effect transistor.

12. The integrated circuit of claim 6, further comprising a spacer layer disposed between the top surface of the substrate and the interfacial layer.

13. A semiconductor structure, comprising:
an interfacial layer comprising a first material disposed on sidewalls of a first channel stack and a second channel stack and on a top surface of a substrate between the first channel stack and the second channel stack;
a high-k dielectric layer comprising a second material disposed on the interfacial layer above the top surface of the substrate and on sidewalls of the interfacial layer, wherein the second material is different than the first material;
a metal gate layer disposed on the high-k dielectric layer above the top surface of the substrate and on sidewalls of the high-k dielectric layer;
a silicon layer disposed on the metal gate layer above the top surface of the substrate and on sidewalls of the metal gate layer;
a silicide layer disposed on the silicon layer and configured to have an opening therein;
an oxide layer disposed in the opening;
an encapsulation layer disposed on a top surface of the first channel stack and the second channel stack and on the silicide layer; and
a nitride layer disposed on the encapsulation layer;
wherein the nitride layer is configured to expose a top surface of the encapsulation layer on the first channel stack and the second channel stack; and wherein the first channel stack comprises a portion of a negative channel field-effect transistor and the second channel stack comprises a portion of a positive channel field-effect transistor.

14. The semiconductor structure of claim 13, wherein the interfacial layer, the high-k dielectric layer, the metal gate layer, the silicon layer and the silicide layer are configured to expose a top portion of the first channel stack and the second channel stack.

15. The semiconductor structure of claim 13, further comprising another oxide layer disposed on the nitride layer, the other oxide layer being configured to expose a top surface of the nitride layer and the top surface of the encapsulation layer on the first channel stack and the second channel stack.

16. The semiconductor structure of claim 13, wherein the first material is silicon dioxide ($SiO_2$) or silicon oxynitride (SiON).

17. The semiconductor structure of claim 16, wherein the second material is hafnium dioxide ($HfO_2$), lanthanum oxide ($La_2O_3$), zirconium oxide ($Zr_2O_3$), or aluminum oxide ($Al_2O_3$).

18. The semiconductor structure of claim 13, further comprising a spacer layer disposed between the top surface of the substrate and the interfacial layer.

19. The semiconductor structure of claim 1, wherein the first material is silicon dioxide ($SiO_2$) or silicon oxynitride (SiON).

20. The semiconductor structure of claim 19, wherein the second material is hafnium dioxide ($HfO_2$), lanthanum oxide ($La_2O_3$), zirconium oxide ($Zr_2O_3$), or aluminum oxide ($Al_2O_3$).

\* \* \* \* \*